United States Patent
Tsukamoto et al.

(10) Patent No.: US 8,781,542 B2
(45) Date of Patent: Jul. 15, 2014

(54) HIGH-TEMPERATURE SUPERCONDUCTING MAGNETIC SENSOR AND FABRICATION METHOD OF THE SAME

(75) Inventors: Akira Tsukamoto, Saitama (JP); Seiji Adachi, Chiba (JP); Yasuo Oshikubo, Tokyo (JP); Keiichi Tanabe, Chiba (JP)

(73) Assignee: International Superconductivity Technology Center, Tokyo (JP)

( * ) Notice: Subject to any disclaimer, the term of this patent is extended or adjusted under 35 U.S.C. 154(b) by 185 days.

(21) Appl. No.: 13/326,966

(22) Filed: Dec. 15, 2011

(65) Prior Publication Data
US 2012/0157319 A1 Jun. 21, 2012

(30) Foreign Application Priority Data
Dec. 16, 2010 (JP) .................................. 2010-280196

(51) Int. Cl.
*G01R 33/035* (2006.01)
(52) U.S. Cl.
USPC ........................................................ 505/162
(58) Field of Classification Search
CPC ........................... G01R 33/0358; H01L 39/225
USPC ........................................................ 505/162
See application file for complete search history.

(56) References Cited

U.S. PATENT DOCUMENTS

2006/0119360 A1* 6/2006 Yamamoto et al. ............ 324/318
2009/0174523 A1* 7/2009 Harada et al. ................. 338/301

FOREIGN PATENT DOCUMENTS

JP 6-324129 A 11/1994
JP 2001-91611 A 4/2001

OTHER PUBLICATIONS

J. Clarke et al., "The SQUID Handbook: Fundamentals and Technology of SQUIDS and SQUID Systems", vol. 1 Chapter 1, (twenty-eight (28) pages).
J. M. Jaycox et al., "Planar Coupling Scheme for Ultra Low Noise DC Squids", IEEE Transactions on Magnetics, vol. MAG-17, No. 1, Jan. 1, 1981, pp. 400-403.
A. Tsukamoto et al., "Process of Fabricating YBCO SQUIDs for 51-Channel HTS MCG System", IEEE Transactions on Applied Superconductivity, vol. 15, No. 2, Jun. 2005, pp. 177-180.
Hironori Wakana et al., "Development of Integrated HTS SQUIDs With a Multilayer Structure and Ramp-Edge Josephson Junctions", IEEE Transactions on Applied Superconductivity, vol. 19, No. 3, Jun. 2009, pp. 782-785.
S. Adachi et al., "Preparation of Multilayer Films for Integrated High-Tc SQUIDs with Ramp-Edge Josephson Junctions", Elsevier, vol. 468, No. 20, (2008), pp. 1936-1941.
E. Dantsker et al., High-Tc Super Conducting Quantum Interference Devices with Slots or Holes: Low 1/f Noise in Ambient Magnetic Fields, Appl. Phys. Lett., vol. 70, No. 15, Apr. 14, 1997, pp. 2037-2039.
Japanese Office Action with English translation thereof dated Dec. 3, 2013 {6 pages}.

* cited by examiner

*Primary Examiner* — Colleen Dunn
(74) *Attorney, Agent, or Firm* — Crowell & Moring LLP

(57) ABSTRACT

A high-temperature superconducting magnetic sensor having a superconducting layer formed on a substrate and a plurality of superconducting quantum interference devices fabricated on the superconducting layer, which includes: a plurality of input coils that are formed on the superconducting layer and connected to or magnetically coupled with each of the plurality of the superconducting quantum interference devices; a pickup coil that is formed on the superconducting layer and connected so as to form a closed loop together with the plurality of the input coils; and a plurality of trimming wires that are formed on the superconducting layer and can be cut off, while making a short-circuit between both ends of each of the plurality of the input coils.

20 Claims, 16 Drawing Sheets

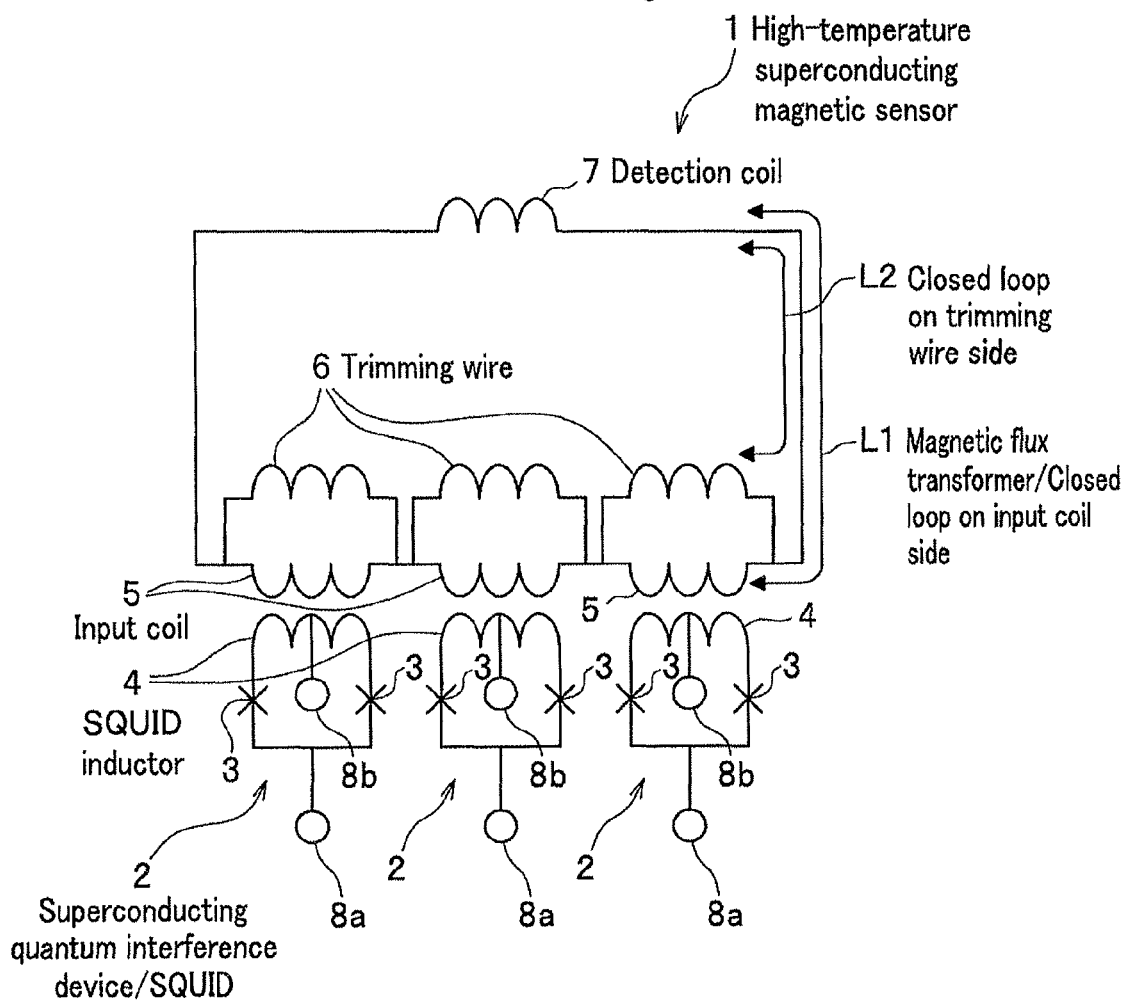

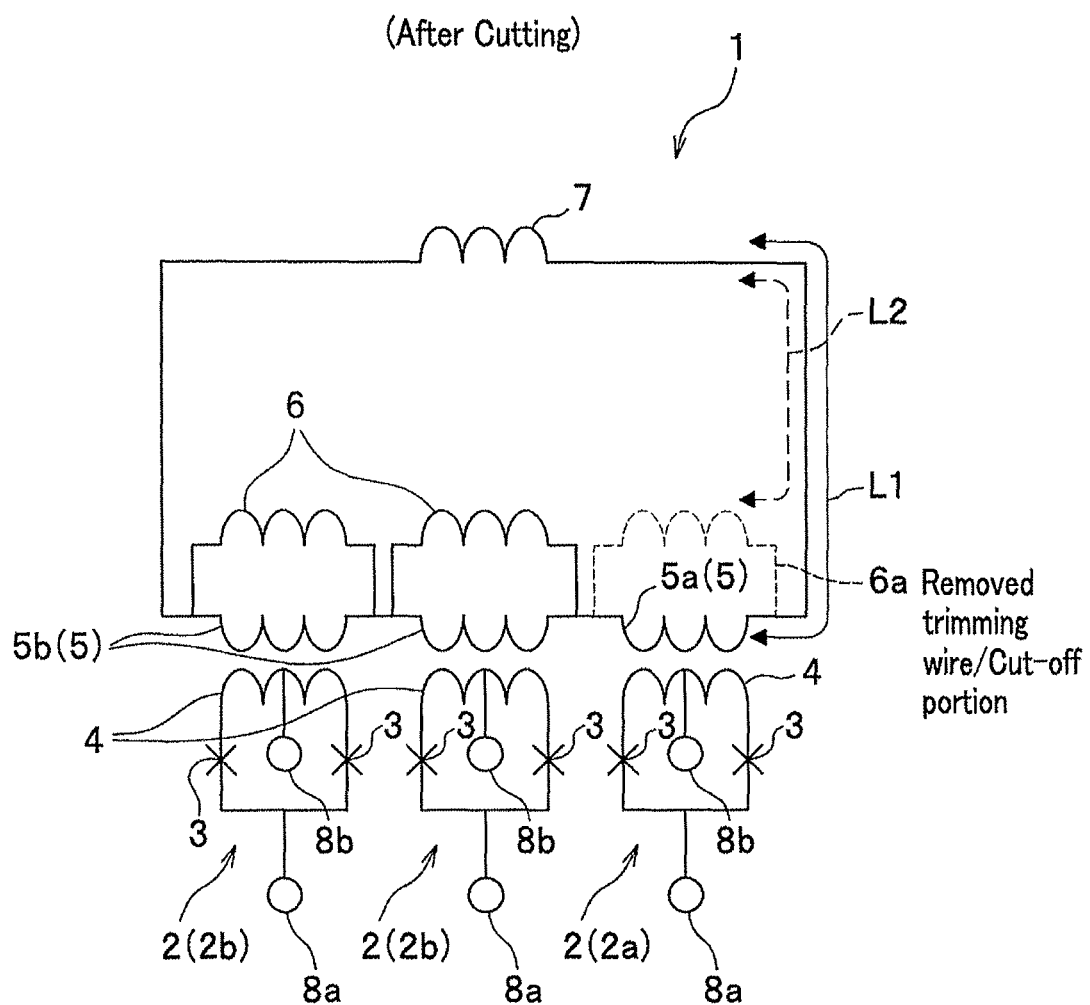

SECOND EMBODIMENT

FOURTH EMBODIMENT

FIFTH EMBODIMENT

HIGH-TEMPERATURE SUPERCONDUCTING MAGNETIC SENSOR AND FABRICATION METHOD OF THE SAME

CROSS REFERENCE TO RELATED APPLICATIONS

This application claims the foreign priority benefit under Title 35, United States Code, §119(a)-(d) of Japanese Patent Application No. 2010-280196, filed on Dec. 16, 2010, the contents of which are hereby incorporated by reference.

BACKGROUND OF THE INVENTION

1. Field of the Invention

The present invention relates to a high-temperature superconducting (hereinafter, referred to as HTS) magnetic sensor that includes a plurality of superconducting quantum interference devices (hereinafter, referred to as SQUID) on a superconducting layer formed on a substrate, and a fabrication method of the HTS magnetic sensor.

2. Description of Related Art

The SQUID is known as a magnetic sensor that has a highest sensitivity for a magnetic signal. Therefore, the SQUID is used for a measurement of a weak biomagnetic signal which is spontaneously generated from a brain or a heart and a nondestructive inspection by a remaining magnetism and an eddy-current testing, and further used for a super-low field MRI (magnetic resonance imaging) in recent years. However, an application of the SQUID has been limited, because expensive and troublesome liquid helium is required for cooling a low-temperature superconductor (hereinafter, referred to as LTS) SQUID. After a high-temperature superconductor (hereinafter, referred to as HTS) that shows a superconducting property at a liquid nitrogen temperature was discovered, a HTS SQUID has been actively developed. Then, at present, a HTS magnetic sensor having a detection sensitivity of less than 100 fT/Hz is available in the market, and further, a HTS magnetic sensor having a detection sensitivity of less than 10 fT/Hz has been reported at a leading-edge research. Since the HTS SQUID can be cooled by liquid nitrogen which is less expensive and easy to handle, the SQUID having various kinds of structures has been proposed (see the following Non-patent documents 1 to 6).

Non-patent document 1 "Chapter 1 Introduction, "The SQUID Handbook: Fundamentals and Technology of SQUIDs and SQUID Systems, Volume I", Edited by John Clarke, Alex I. Braginski, ISBN: 978-3-527-40229-8";

Non-patent document 2 "J. M. Jaycox and M. B. Ketchen, IEEE Trans Magn. MAG-17, 400-403 (1981)";

Non-patent document 3 "A. Tsukamoto, IEEE Trans. Appl. Supercond. Vol. 15 No. 2 (2005) 177-180";

Non-patent document 4 "H. Wakana, S. Adachi, K. Hata, T. Hato, Y. Tarutani, K. Tanabe, IEEE Trans. Appl. Supercond. Vol. 19 No. 3 (2009) 782-785";

Non-patent document 5 "S. Adachi, K. Hata, T. Hato, Y. Tarutani, K. Tanabe, Physica C, vol. 468, No. 15-20, pp. 1936-1941, (2008)"; and Non-patent document 6 "E. Dantsker, S. Tanaka, J. Clarke, Appl. Phys. Lett. Vol. 70 No. 15 (1997) 2037-2039"

A basic structure of a SQUID is proposed in the Non-patent document 1 "Chapter 1 Introduction, "The SQUID Handbook: Fundamentals and Technology of SQUIDs and SQUID Systems, Volume I", Edited by John Clarke, Alex I. Braginski, ISBN: 978-3-527-40229-8". The SQUID has a closed loop structure consisting of a SQUID inductor and two Josephson junctions. If a bias current $I_b$, which is a little larger than a critical current $I_c$, is applied between electrodes of the SQUID in order to generate a voltage V in the two Josephson junctions, a voltage generated between the terminals of the respective Josephson junctions periodically varies with a cycle of a flux quantum $\Phi_0$ ($2.07 \times 10^{-15}$ Wb) by a magnetic flux $\Phi$ that interlinks with the closed loop structure. An extremely small magnetic flux change of $1/10^5$ to $1/10^6$ of the flux quantum $\Phi_0$ can be measured by a feedback control using a flux locked loop circuit (FLL circuit).

Since a size of a SQUID is small ranging from dozens of μm to hundreds of μm in general, when the SQUID is used as a high sensitive magnetic sensor, a pickup coil having a larger size is used. The pickup coil configures a flux transformer (closed loop structure) together with an input coil, and the flux transformer is used in such a manner that the input coil is magnetically coupled with the SQUID. If the effect of inductance of a wiring portion between the input coil and the pickup coil is neglected, a magnetic flux $\Phi_s$ detected by the SQUID when an external magnetic field B is applied to the pickup coil is expressed by Formula (1).

$$\Phi_s = I_p \cdot M \qquad (1)$$
$$= BA_p \cdot M / (L_p + L_i)$$
$$= BA_p \cdot k(L_i \cdot L_s)^{1/2} / (L_p + L_i)$$

where, $L_s$ is an inductance of a SQUID inductor, $A_p$ is an area of a pickup coil, $L_p$ is an inductance of the pickup coil, $L_i$ is an inductance of an input coil, and M is a mutual inductance between the SQUID and the input coil.

Here, $I_p$ is a shielding current flowing in a flux transformer, the mutual inductance M has a relation of $M = k(L_i \cdot L_s)^{1/2}$, and k is a coupling coefficient (0<k<1). A ratio of the magnetic flux $\Phi_s$ detected by the SQUID to the external magnetic field B is called an effective area $A_{eff}$, and has a relation expressed by Formula (2).

$$A_{eff} = \Phi_s / B \qquad (2)$$
$$= A_p \cdot M / (L_p + L_i)$$
$$= A_p \cdot k(L_i \cdot L_s)^{1/2} / (L_p + L_i)$$

Formula (2) indicates that a detection sensitivity (magnetic flux $\Phi_s$ detected by SQUID) of a SQUID magnetic sensor becomes higher as the effective area $A_{eff}$ becomes larger. If the inductance $L_s$ of the SQUID is too large, a modulation voltage amplitude $\Delta V$ of the SQUID decreases and magnetic flux noises increase. Therefore, a value of the inductance $L_s$ is generally about 40 to 100 pH. In addition, since a size and a shape of the pickup coil are determined depending on the application, values of the area $A_p$ and inductance $L_p$ of the pickup coil are given parameters. Therefore, adjustable parameters for maximizing the effective area $A_{eff}$ in Formula (2) are the coupling coefficient k and the inductance $L_i$ of the input coil. The coupling coefficient k has the maximum value "1" when a magnetic coupling between the input coil and the SQUID is perfect, and at this time, the effective area $A_{eff}$ is also maximized. On the other hand, with respect to the inductance $L_i$ of the input coil, when the inductance $L_i$ is equal to the inductance $L_p$ of the pickup coil ($L_i = L_p$), the effective area $A_{eff}$ becomes maximum ($A_{eff} = A_p(L_s/L_i)^{1/2}/2$).

An integrated SQUID having an ideal structure is proposed in Non-patent document 2 "J. M. Jaycox and M. B. Ketchen, IEEE Trans Magn. MAG-17, 400-403 (1981)". The integrated SQUID has a structure where an input coil having a multi-turn structure is stacked on a washer-type SQUID inductor through a thin insulating layer, and the coupling coefficient k close to "1" can be obtained. In addition, the number of turns of the input coil is optimized so that the inductance $L_p$ of the pickup coil becomes equal to the inductance $L_i$ of the input coil ($L_i$=$L_p$). However, the Non-patent document 2 describes the case of a low-temperature superconducting SQUID (LTS-SQUID) which uses Nb as the superconductor, and a fabrication yield of the integrated SQUID using a HTS is low. This is caused by the following reasons. In a HTS composed of multielement composite oxide, it is likely to generate precipitates by composition shift and segregation, and as a result, it is likely to cause a breakdown of an interlayer insulating layer between two HTS layers (top and bottom), and likely to cause degradations of thin film characteristics and a junction during a multilayer process.

In the Non-patent document 3 "A. Tsukamoto, IEEE Trans. Appl. Supercond. Vol. 15 No. 2 (2005) 177-180", a directly-coupled SQUID is proposed. The directly-coupled SQUID can be fabricated using a single layer superconductor film. A grain boundary junction such as a bicrystal junction or a step-edge junction that may be formed using a single layer superconductor film, is used for a Josephson junction. In the directly-coupled SQUID, a pickup coil (inductance $L_p$) is directly connected to a slit-hole type SQUID inductor (inductance $L_s$), and an input coil (inductance $L_i$) is omitted because the SQUID inductor (inductance $L_s$) has a function as the input coil. Namely, the directly-coupled SQUID has a structure where a shielding current $I_p$ to be induced by a magnetic flux that interlinks with the pickup coil (inductance $L_p$) directly flows in the SQUID inductor (inductance $L_s$). In the directly-coupled SQUID, the inductance $L_i$ of the input coil is equal to the inductance $L_s$ of the SQUID inductor since the SQUID inductor has a function as the input coil ($L_i$=$L_s$). The inductance $L_p$ of the pickup coil ranges from several nH to several tens of nH, then the inductance $L_p$ is larger than the inductance $L_s$ of the SQUID inductor ($L_p$>>$L_s$). The effective area $A_{eff}$ of this case is expressed by an approximation formula of Formula (3) from Formula (2). The effective area $A_{eff}$ of this case (coupling efficiency between the pickup coil and the SQUID) is smaller than the effective area $A_{eff}$ ($A_{eff}$=$A_p$ $(L_s/L_i)^{1/2}/2$) of the Non-patent document 2, as shown by the following equation.

$$A_{eff}=A_p \cdot L_s/(L_p+L_s) \quad (3)$$

In addition, the Non-patent document 3 describes that junction characteristics of the HTS also scatter in the fabrication of the SQUID using even in a single layer superconductor thin film. For example, although a critical current of SQUID about 10 to 100 µA, ideally, 10 to 20 µA, is required at the operation temperature, the critical current may be over 100 µA in some cases and the yield is decreased. Therefore, the following was attempted to improve the yield. A plurality of SQUIDs are connected in series to the same pickup coil, and a SQUID having good characteristics is selected from the plurality of SQUIDs and used in order to improve the yield. In the Non-patent document 3, an inductance $L_s$ of SQUID inductor of the non-selected SQUID also functions as to be added to the inductance $L_p$ of the pickup coil. Namely, the effective area $A_{eff}$ in the case that n SQUIDs ($n_{th}$ inductance is denoted by $L_{s,n}$) are arranged in series is expressed by Formula (4).

$$A_{eff}=A_p \cdot L_s/(L_p+\Sigma L_{s,n}) \quad (4)$$

Here, $\Sigma L_{s,n}$ indicates a total sum ($L_{s,1}+L_{s,2}+\ldots+L_{s,n}$) of SQUID inductors of the n SQUIDs. Comparing with Formula (3), the denomination increases by about $\Sigma L_{s,n}\cdot(n-1)/n$, then, the $A_{eff}$ decreases. However, in the case of the directly-coupled, generally, the inductance $L_p$ of the pickup coil is two orders of magnitude larger than the inductance $L_s$ of the SQUID inductor ($L_p$>>$L_s$). In this case, a decrease of the effective area $A_{eff}$ due to arrangement of the plurality of SQUIDs in series is small, and it is no matter for practical use.

The research institute to which the inventors belong is promoting a development of an integrated SQUID which has a high sensitivity comparable to the sensitivity of LTS-SQUID, by using a HTS. A prototype integrated SQUID having a structure that an input coil is stacked on a SQUID inductor was fabricated successfully using a HTS multilayer process which includes two superconducting layers (See Non-patent document 4 "H. Wakana, S. Adachi, K. Hata, T. Hato, Y. Tarutani, K. Tanabe, IEEE Trans. Appl. Supercond. Vol. 19 No. 3 (2009) 782-785", and Non-patent document 5 "S. Adachi, K. Hata, T. Hato, Y. Tarutani, K. Tanabe, Physica C, vol. 468, No. 15-20, pp. 1936-1941, (2008)"). This integrated SQUID also has a structure that an input coil having a multi-turn structure is stacked on a washer-type SQUID inductor through a thin insulating layer, and the coupling coefficient k close to "1" can be obtained. In addition, an excellent noise characteristic of 20 to 40 fT/Hz$^{1/2}$ has been obtained. However, the yield was decreased in some cases, for example, by defects in interlayer insulation, in addition to variations of junction characteristics specific to a HTS.

As with the directly-coupled SQUID of the Non-patent document 3, it is considered that the yield of the HTS magnetic sensor may be improved by connecting the integrated SQUIDs of the Non-patent documents 4 and 5 in series. However, different from the case of the Non-patent document 3, it is considered that the effective area $A_{eff}$, that is, the detection sensitivity may be decreased. The effective area $A_{eff}$ of a structure that arranges n integrated SQUIDs in series is expressed by Formula (5), which is derived from Formula (2).

$$A_{eff}=A_p \cdot k(L_i \cdot L_s)^{1/2}/(L_p+\Sigma L_{i,n}) \quad (5)$$

Here, $\Sigma L_{i,n}$ indicates a total sum ($L_{i,1}+L_{i,2}+\ldots+L_{i,n}$) of inductances of input coils of the n integrated SQUIDs. In the integrated SQUID, since the inductance $L_p$ of the pickup coil and the inductance $L_i$ of the input coil are designed to be equal ($L_i$=$L_p$), the effective area $A_{eff}$ is about 2/(n+1) times in comparison with the case of a single integrated SQUID. Then, regarding the integrated SQUID, it has been considered that a structure that connects a plurality of SQUIDs in series appears to be impracticable, and accordingly, there is no example of trial fabrication of the structure until now. As described above, a method for improving the yield of the integrated SQUID, which easily loses the yield, has been expected. However, if a good integrated SQUID can be selected and used from a plurality of integrated SQUIDs in a HTS magnetic sensor, there is an advantage because a yield of the HTS magnetic sensor can be improved even if the yield of individual integrated SQUID is low.

On the other hand, although the integrated SQUID is advantageous in the detection sensitivity (effective area $A_{eff}$), there is a disadvantage that a magnetic flux trap is likely to occur in comparison with a directly-coupled SQUID. A cooling of the HTS SQUID is easier than that of a LTS-SQUID which requires liquid helium for the cooling, and a wide application of the HTS SQUID is actively studied. For example, an application for outdoor usage such as a geological survey, where the procurement of liquid helium is difficult, and an application for non-destructive inspection at a factory are studied. In both cases, since the SQUID is used in an environment provided with no magnetic shield in most cases, the HTS SQUID is cooled in the Earth field. In this case, if a phenomenon to trap a magnetic flux in the superconductor occurs, noises are generated in the SQUID by the movement of the trapped magnetic flux, and as a result, a measurement of a weak signal becomes difficult. There is a relation expressed by the following Formula (6) between an intensity of a threshold magnetic field $B_1$ at which the trapping phenomenon starts and a size of the superconductor (See Non-patent document 6 "E. Dantsker, S. Tanaka, J. Clarke, Appl. Phys. Lett. Vol. 70 No. 15 (1997) 2037-2039"). Meanwhile, w is a width of the superconductor.

$$B_1 = \pi \Phi_0 / 4 w^2 \quad (6)$$

A width of a SQUID inductor of a directly-coupled SQUID is about 5 μm, then, the threshold magnetic field $B_1$ derived from Formula (6) is about 65 μT. Since the Earth field in Japan is about 30 to 50 μT, the magnetic flux trap of the directly-coupled SQUID is not likely to occur by the cooling in the Earth field. On the other hand, the integrated SQUID has a structure that stacks an input coil on a SQUID inductor in order to efficiently magnetically couple the multi-turn input coil with the SQUID inductor. As a result, the width of the SQUID inductor becomes wide, and generally, the width is about 100 to 300 μm. Even if the width is 100 μm, the threshold magnetic field $B_1$ is 0.16 μT, which is below the Earth field. Therefore, with respect to the integrated SQUID, the magnetic flux trap is likely to occur if the SQUID is used by the cooling in the Earth field.

The Non-patent document 6 proposes an integrated SQUID that can prevent the magnetic flux trap. In the integrated SQUID, even if a width of the SQUID inductor is wide, an occurrence of the magnetic flux trap is prevented by narrowing a minimum line width that configures the SQUID inductor by, for example, forming a body of the SQUID inductor into a mesh structure, or disposing slit holes.

In addition, a dynamic range is another disadvantage of the integrated SQUID. In the integrated SQUID, a superconductive contact between two superconductor layers (top and bottom) is inevitably required at a portion of the input coil to be stacked and having a multi-turn structure. It is known that a critical current density of the HTS decreases at the superconductive contact. Therefore, the critical current of a magnetic transformer consisting of a pickup coil and an input coil is limited by the critical current at a superconductive contact of the input coil portion. This means that even if the pickup coil receives a large magnetic field change, there is an upper limit with respect to a flowing shielding current, and thereby, a dynamic range is limited. On the other hand, since a directly-coupled SQUID is formed by a single superconductor thin film, there is no superconductive contact between the two superconductor layers (top and bottom). Therefore, a dynamic range of measurement of the directly-coupled SQUID becomes wide.

As described above, an integrated SQUID is advantageous in sensitivity, and a directly-coupled SQUID has advantages that the magnetic flux trap is not likely to occur and the dynamic range is wider. Therefore, it is required to select the integrated SQUID or the directly-coupled SQUID depending on the application of the SQUID. Meanwhile, if it is capable to select an integrated SQUID or a directly-coupled SQUID in a single HTS magnetic sensor, a high sensitivity and wide dynamic range are both obtained. This is advantageous and useful.

In addition, as a cooling method of a HTS magnetic sensor, there are two methods that are a direct cooling by liquid nitrogen and an indirect cooling by thermal conduction via a rod cooled by a refrigerator cooling or liquid nitrogen. Then, a temperature (operation temperature) of the SQUID varies depending on a cooling method to be used, and an optimum value of critical current of the SQUID also varies. For example, in the case that the SQUID is cooled via a rod cooled by liquid nitrogen, it is considered that the operation temperature is increased by 1 to 2 K in comparison with 77 K that is the operation temperature in the case that the SQUID is directly cooled by liquid nitrogen. In order to achieve a critical current of 20 to 100 μA at the operation temperature, it is required to design a critical current value to be larger at 77 K, for example, by forming a junction width to be wider in advance. Meanwhile, in a single HTS magnetic sensor, if it is capable to select a SQUID from a plurality of (integrated) SQUIDs that are different in characteristics and structures like different junction widths depending on the cooling method (operation temperature), the HTS magnetic sensor can be used without depending on/considering the cooling method (operation temperature). This is advantageous and useful.

As described above, if it is capable to select and use a desired SQUID from a plurality of SQUIDs within a single HTS magnetic sensor, a yield of the HTS magnetic sensor can be increased, a high sensitivity and wide dynamic rage are both obtained, and the HTS magnetic sensor can be used without depending on/considering a cooling method (operation temperature). This is advantageous and useful.

It is, therefore, an object of the present invention to provide a HTS magnetic sensor which has a plurality of SQUIDs and capable of selecting and using a desired SQUID from the plurality of SQUIDs, and a fabrication method of the HTS magnetic sensor.

SUMMARY OF THE INVENTION

In order to solve the foregoing problems, according to the present invention, there is provided a HTS magnetic sensor that has a superconducting layer formed on a substrate and a plurality of superconducting quantum interference devices (SQUID) fabricated on the superconducting layer. The HTS magnetic sensor includes: a plurality of input coils that are formed on the superconducting layer and connected to or magnetically coupled with each of the plurality of the superconducting quantum interference devices; a pickup coil that is formed on the superconducting layer and connected so as to form a closed loop together with the plurality of the input coils; and a plurality of trimming wires that are formed on the superconducting layer and can be cut off, while making a short-circuit between both ends of each of the plurality of the input coils.

In addition, according to the present invention, there is provided a method for fabricating a HTS magnetic sensor that has a superconducting layer formed on a substrate and a plurality of superconducting quantum interference devices fabricated on the superconducting layer. The method includes steps of: forming a plurality of input coils that are connected to or magnetically coupled with each of the plurality of the superconducting quantum interference devices, a pickup coil that is connected so as to form a closed loop together with the plurality of the input coils and a plurality of trimming wires that shunt between both ends of each of the plurality of the input coils, on the superconducting layer; selecting a superconducting quantum interference device suitable for an application of the HTS magnetic sensor from the plurality of the superconducting quantum interference devices based on measurement results of electric and magnetic characteristics of the plurality of the superconducting quantum interference devices; and cutting off a trimming wire that shunts between both ends of an input coil that is connected to or magnetically coupled with the selected superconducting quantum interference device.

According to the present invention, there is provided a HTS magnetic sensor that has a plurality of superconducting quantum interference devices (SQUID) from which a desired SQUID can be selected and used, and a method for fabricating the HTS magnetic sensor.

BRIEF DESCRIPTION OF THE DRAWINGS

FIG. 1A is a circuit diagram of a HTS magnetic sensor (before a trimming wire is cut off) according to a first embodiment of the present invention;

FIG. 1B is a circuit diagram of a HTS magnetic sensor (after a trimming wire is cut off) according to the first embodiment of the present invention;

DETAILED DESCRIPTION OF THE PREFERRED EMBODIMENT

Figure 2A:
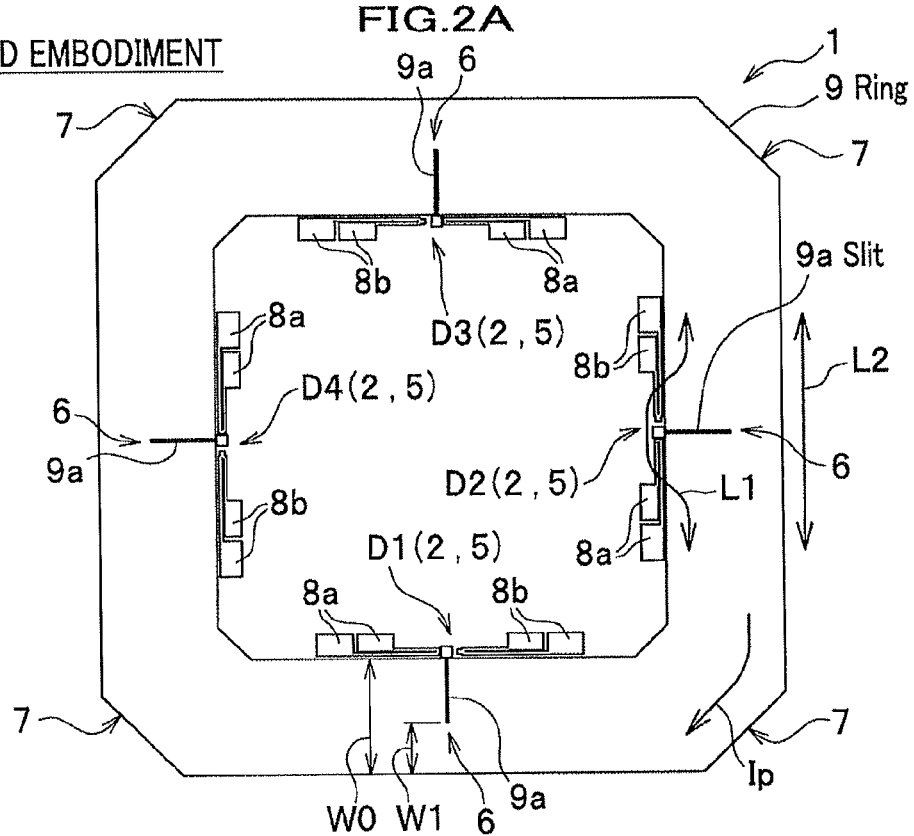
FIG. 2A is a plan view of a HTS magnetic sensor (before a trimming wire is cut off) according to a second embodiment of the present invention.

Next, embodiments of the present invention will be explained in detail by referring to drawings as appropriate. Apart common to the drawings is given the same reference number and a duplicated explanation will be omitted. It is noted that the following disclosures are examples according to the embodiments of the present invention and a technology extent of the present invention is not limited to the disclosures.

(First Embodiment)

A circuit diagram of a high-temperature superconducting (hereinafter, referred to as HTS) magnetic sensor 1 according to a first embodiment of the present invention is shown in FIG. 1A. FIG. 1A shows a status before a trimming wire 6 is cut off. The HTS magnetic sensor 1 includes a plurality (three in FIG. 1A) of superconducting quantum interference devices (SQUID) 2.

The SQUID 2 has a closed loop structure that connects two Josephson junctions 3 and a SQUID inductor 4 in series. An electrode 8b is connected between the two Josephson junctions 3 on the side that the SQUID inductor 4 is connected, and an electrode 8a is connected on the side that no SQUID inductor 4 is connected. An input coil 5 which is connected to or magnetically coupled with the SQUID inductor 4 is placed for each SQUID. A plurality of the input coils 5 are connected in series. A pickup coil 7 is connected to both ends of a serial connection of the plurality of the input coils 5, and a flux transformer (a closed loop on the input coil side) L1, where the plurality of the input coils 5 and the pickup coil 7 are connected in series, is formed.

Each of a plurality of trimming wires 6 is connected between both ends of the input coil 5 so as to make a short circuit between the both ends of the input coil 5. Then, the plurality of the trimming wires 6 are connected in series, and the pickup coil 7 is connected to both ends of a serial connection of the plurality of the trimming wires 6 to form a closed loop L2, where the plurality of the trimming wires 6 and the pickup coil 7 are connected inn series, on the trimming wire side. An inductance $L_w$ of the trimming wire 6 is set to be smaller than an inductance $L_s$ of the input coil 5. Each of the trimming wires 6 can be cut off, individually.

Based on measurement results of the electric and magnetic characteristics of a plurality of SQUIDs 2, a proper SQUID 2 which is suitable for the application of the HTS magnetic sensor 1 is selected from the plurality of SQUIDs 2. After that, a trimming wire 6 making a short circuit between both ends of the input coil 5 which is connected to or magnetically coupled with the selected SQUID 2 is cut off.

A circuit diagram showing a status that one of the trimming wires 6 of the HTS magnetic sensor 1 according to the first embodiment of the present invention is cut off, is shown in FIG. 1B. In the example shown in FIG. 1B, a trimming wire 6 on the right side among the three trimming wires 6 is cut off, generating a cut-off portion 6a. Then, even though both ends of an input coil 5 (5b) which is one part of the plurality of input coils 5 is shunted by the trimming wire 6, however, the both ends of an input coil 5 (5a) which is the other part of the plurality of input coils 5 is not shunted. As a result, in the example in FIG. 1B, the SQUID 2 (2a) on the right side becomes usable, and the other SQUID 2 (2b) remains unusable. Since a shielding current flows in a smaller inductance, if the input coil 5 (5b) is shunted by the trimming wire 6, the shielding current flows in the trimming wire 6 and does not flow in the input coil 5 (5b). On the other hand, the shielding current flows in the input coil 5 (5a) where the trimming wire 6 is cut off. Namely, the SQUID 2 (2a) that has a SQUID inductor 4 which is magnetically coupled with the input coil 5 (5a), where the shielding current flows, is operated and used. Meanwhile, the closed loop L2 that is formed on the trimming wire side by the plurality of the trimming wires 6 and the pickup coil 7 is opened by the cut-off portion 6a. On the other hand, the closed loop L1 formed on the input coil side by the plurality of the input coils 5 and the pickup coil 7 remains in a closed state regardless of existence of the cut-off portion 6a.

An effective area $A_{eff}$ in the structure of the HTS magnetic sensor 1 is expressed by the following Formula (7).

$$A_{eff} = A_p \cdot k(L_i \cdot L_s)^{1/2}/(L_p + L_i + (n-1)L_w) \quad (7)$$

where n is the number of integrated SQUIDs connected in series, and $L_w$ is an inductance of the trimming wire 6. Since the $A_{eff}$ becomes equal to $A_{eff}$ in Formula (2) in the case that a single integrated SQUID is connected to the pickup coil 7 by sufficiently decreasing the inductance $L_w$ of the trimming wire 6 in comparison with the inductance $L_i$ of the input coil 5 ($L_w \ll L_i$), a lowering of the sensitivity due to arrangement of a plurality of SQUIDs can be avoided. Then, in the first embodiment, the inductance $L_w$ of the trimming wire 6 is set to sufficiently lower than the inductance $L_i$ of the input coil 5 ($L_w \ll L_i$). Accordingly, in the first embodiment, even if a plurality of SQUIDs 2 are arranged, the lowering of the sensitivity is not caused, and it is possible to select and use a SQUID 2 suitable for the application from the plurality of SQUIDs 2. Since a proper SQUID 2 can be selected and used from a plurality of SQUIDs 2 within a single HTS magnetic sensor 1, a yield of the HTS magnetic sensor 1 can be improved, even if a yield of individual integrated SQUID 2 is low. This is advantageous and useful.

In the first embodiment, when the SQUID 2 is selected, all input coils 5 are shunted in advance by the trimming wires 6, and a trimming wire 6 corresponding to the SQUID 2 which is selected and used is cut off. However, the procedure is not limited to this. For example, the input coils 5 are not shunted in advance by the trimming wires 6, and when the SQUID 2 is selected, both ends of input coil 5 (5b) except for the input coil 5 (5a) which corresponds to the SQUID 2 selected and used may be shunted by the trimming wires 6.

Meanwhile, in the selection of the SQUID 2, the SQUID 2 may be selected through evaluation of electric and magnetic characteristics and observation of various kinds of shapes by a microscope, for example. In addition, the SQUID 2 may be selected from designed parameters. Namely, if a plurality of integrated SQUIDs 2 having different structures to each other in designed parameters are designed and fabricated in advance, a desired integrated SQUID 2 can be selected from the plurality of integrated SQUIDs 2 having the different structures depending on a cooling method (operation temperature) within a single HTS magnetic sensor 1. This is advantageous and useful. As a designed parameter which differentiates the structure, for example, a junction width of a Josephson junction 3 of the SQUID 2, the inductance $L_i$ of the input coil 5 and the inductance $L_s$ of the SQUID inductor 4 may be adopted. If a plurality of integrated SQUIDs 2 or input coils 5 having different structures to each other in design parameters are designed and fabricated in advance, a desired integrated SQUID 2 can be selected from the plurality of the integrated SQUIDs 2 having different structures to each other depending on the purpose of the application within a single HTS magnetic sensor 1. Therefore, a single HTS magnetic sensor 1 can be used for many purposes regardless of the present purpose. This is advantageous and useful.

In addition, in the first embodiment, the input coils 5 which are magnetically coupled with a plurality of the integrated SQUIDs 2 are connected in series. However, as will be described in detail in a third embodiment, input coils 5 magnetically coupled with a plurality of the integrated SQUIDs 2 and input coils 5 (which also worked as the SQUID inductor 4) connected to a plurality of directly-coupled SQUIDs 2 may be connected in series. According to this configuration, the integrated SQUID 2 or the directly-coupled SQUID 2 may be selected within a single HTS magnetic sensor. Therefore, a high sensitivity and a wide dynamic range are selected in the single HTS magnetic sensor. This is advantageous and useful.

Meanwhile, it is likely to be considered that the HTS magnetic sensor 1 after the trimming wire 6 is cut off is high sensitive and useful, and that the HTS magnetic sensor 1 before the trimming wire 6 is cut off (including the HTS magnetic sensor 1 which is not provided with the trimming wire 6) is less sensitive and not useful. However, this is not correct. This is not merely because the HTS magnetic sensor 1 before the trimming wire 6 is cut off becomes useful after the trimming wire 6 is cut off, but because the HTS magnetic sensor 1 before the trimming wire 6 is cut off has a useful function that electrical and magnetic characteristics of the plurality of SQUIDs 2 included in the HTS magnetic sensor 1 before the trimming wire 6 is cut off (including the HTS magnetic sensor 1 which is not provided with the trimming wire 6) can be measured, even though the sensitivity thereof is poor, and based on the zo measured characteristics, a desired directly-coupled SQUID 2 can be selected. This useful function exists regardless of whether the trimming wire 6 is disposed in advance before the SQUID 2 is selected in the HTS magnetic sensor 1, or the trimming wire 6 is disposed after the SQUID 2 is selected and the unused directly-coupled SQUID is made inoperative. Conventionally, this function has been missed, and even the HTS magnetic sensor 1 having the trimming wire 6 which is not cut off (including the HTS magnetic sensor 1 which is not provided with the trimming wire 6) has not been fabricated so far.

(Second Embodiment)

A plan view of the HTS magnetic sensor 1 according to a second embodiment of the present invention is shown in FIG. 2A. FIG. 2A shows a status before the trimming wire 6 is cut off. The second embodiment is identical to the first embodiment except that a plan view of the HTS magnetic sensor 1 is more specifically shown and the HTS magnetic sensor 1 has four SQUIDs 2. There is no big difference between circuit configurations of the first embodiment and the second embodiment.

The HTS magnetic sensor 1 has a thin film ring 9 on an outer side thereof. Outlines on the outer side and inner side of the ring 9 are both substantially square (rectangular). The input coils 5 and integrated SQUIDs 2 (D1, D2, D3, D4) are disposed inside the ring 9 near the center of each side of the rectangular ring 9. Four input coils 4 and four integrated SQUIDs 2 (D1, D2, D3, D4) are disposed. The four integrated SQUIDs 2 are distinguished to each other for convenience, and an integrated SQUID 2 (D1) is arranged on the bottom side of the rectangular shape of the ring 9, and furthermore, in a counterclockwise fashion, an integrated SQUID 2 (D2) is arranged on the right side of the rectangular shape of the ring 9, an integrated SQUID 2 (D3) is arranged on the upper side of the rectangular shape of the ring 9 and an integrated SQUID 2 (D4) is arranged on the left side of the rectangular shape of the ring 9. Two electrodes 8a and two electrodes 8b are disposed for each integrated SQUID 2 (D1, D2, D3, D4) along the inner side of the ring 9.

A slit 9a is disposed in the ring 9 close to the input coil 5 and the integrated SQUID 2 (D1, D2, D3, D4). The slit 9a reaches an inner edge of the ring 9, but does not reach an outer edge of the ring 9. Since the slit 9 does not reach the outer edge of the ring 9, the ring 9 forms a closed loop and is not opened.

An area outside the area of the slit 9a in the ring 9 forms a trimming wire 6. Four slits 9a and four trimming wires 6 are disposed. The trimming wire 6 is arranged on outer circumferential side of the ring 9, and the input coil 5 and the integrated SQUID 2 (D1, D2, D3, D4) are arranged inside the ring 9. In addition, the slit 9a is formed in an area between the input coil 5 and the trimming wire 6. An area except the trimming wire 6 and the slit 9a within the ring 9 is a pickup coil 7. A width W1 of the ring 9 corresponding to the trimming wire 6 is narrower than a width W0 of the ring 9 corresponding to the pickup coil 7. In the ring 9, the pickup coil 7 divided into four and four (plural) trimming wires 6 are alternately connected in series to form a closed loop L2 on the trimming wire side.

Since it can be assumed that a length of the trimming wire 6 is substantially similar size to a width of the slit 9a, and thereby since the trimming wire 6 is a superconductor having a short length compared with the width W1 thereof, an inductance $L_w$ of the trimming wire 6 is sufficiently smaller than a inductance $L_i$ of the input coil 5 ($L_w \ll L_i$). Therefore, when a shielding current $I_p$ is generated in the pickup coil 7, the shielding current $I_p$ mainly flows in the closed loop L2 on the trimming wire side through the trimming wire 6, and hardly flows in a flux transformer (a closed loop on the input coil side) L1 through the input coil 5.

Figure 2B:
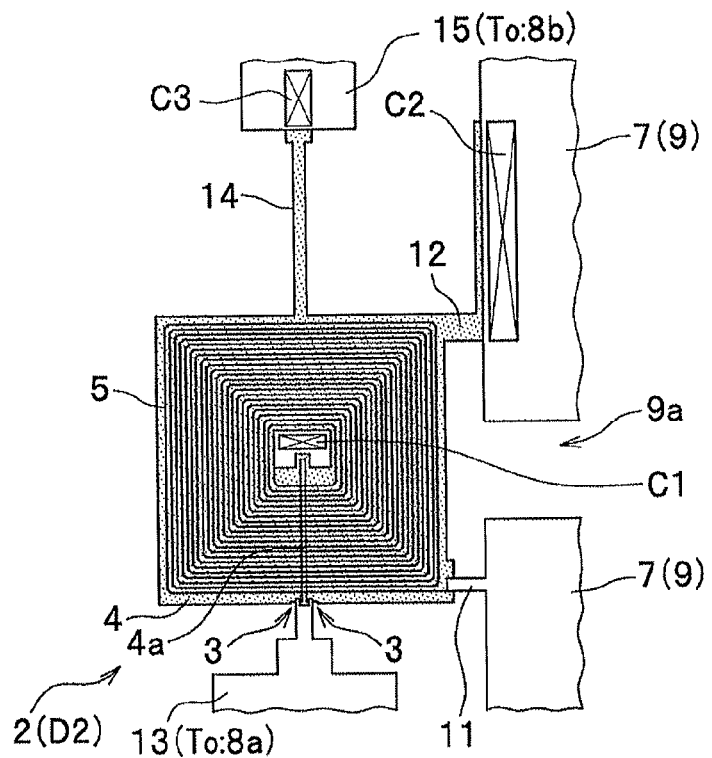
FIG. 2B is an enlarged view around a superconducting quantum interference device D2 of FIG. 2A.

An enlarged view around the integrated SQUID 2 (D2) of FIG. 2A is shown in FIG. 2B. The integrated SQUID 2 (D2) has a closed loop structure where two Josephson junctions 3 and a SQUID inductor 4 are connected in series. A ramp-edge junction is used for the Josephson junction 3. A dot-hatching area in all plan views of all drawings including FIG. 2B indicates an area where a HTS layer (first superconducting layer) DL on the bottom side (see FIG. 7A to FIG. 7E) of the two HTS layers (top and bottom) formed on the substrate 21 (see FIG. 7A to FIG. 7E) is arranged, and a non-hatched area (outlined area) indicates an area where a second superconducting layer UL on the top side is arranged above the first superconducting layer on the bottom side through an insulating area 22 (see FIG. 7A to FIG. 7E). These display methods are common in FIG. 2A, FIG. 4, FIG. 10A, FIG. 10B, FIG. 11A, FIG. 11B, FIG. 12A, FIG. 12B, FIG. 12C and FIG. 14. In the Josephson junction 3, the second superconducting layer UL is contacted with a ramp edge portion of the first superconducting layer DL from above, and the first superconducting layer DL overlaps with the second superconducting layer UL.

The SQUID inductor 4 is a one-turn coil having a washer-type structure (a rectangular C-shape). The SQUID inductor 4 is formed by the first superconducting layer DL at the bottom side. The SQUID inductor 4 has a patterned shape having substantially a square shape (rectangular shape), and a slit 4a is cut from the center of one side of the square shape toward the center of the square shape. A Josephson junction 3 is formed on each side of the slit 4a at an outer circumferential portion of the SQUID inductor 4. Then, one end of each of the two Josephson junctions 3 is connected to the SQUID inductor 4, and the other end of each of the two Josephson junctions 3 is connected to an electrode 8a through a wiring 13, while the other ends of the two Josephson junctions 3 are connected to each other. In addition, a wiring 14 is drawn out from around the center of a side facing the side where the slit 4a of the square shape of the SQUID inductor 4 is formed. The wiring 14 is connected to a wiring 15 through a contact hole C3 disposed in an insulating layer 22 (see FIG. 7A to FIG. 7E), which is not shown, and the wiring 15 is connected to an electrode 8b.

An input coil 5 having a spiral multi-turn structure is formed above the SQUID inductor 4 through the insulating layer 22 (see FIG. 7A to FIG. 7E). The SQUID inductor 4 is formed in the first superconducting layer DL (see FIG. 7A to FIG. 7E) at the bottom side, and the input coil 5 is formed in the second superconducting layer UL (see FIG. 7A to FIG. 7E) at the top side. Since the insulating layer 22 is disposed between the first superconducting layer DL and the second superconducting layer UL, the SQUID inductor 4 faces the input coil 5 across the insulating layer 22. Therefore, a coupling coefficient k between the SQUID inductor 4 and the input coil 5 close to "1" can be obtained. The input coil 5 may be formed, for example, in such a manner that a winding wire width is 2 μm and the number of turn is 20 as shown in FIG. 2B. An outer terminal of the input coil 5 is connected to one end of a pickup coil 7 by a wiring 11. An inner terminal of the input coil 5 is connected to the SQUID inductor 4 through a contact hole C1 disposed in the insulating layer 22 (see FIG. 7A to FIG. 7E). The SQUID inductor 4 is connected to the pickup coil 7 through a contact hole C2 disposed in the wiring 12 and the insulating layer 22 (see FIG. 7A to FIG. 7E). As described above, the wiring 11, the input coil 5, the contact hole C1, a part of the SQUID inductor 4, the wiring 12 and the contact hole C2 are sequentially connected between the pickup coils 7 which are divided by the slits 9a. Then, the input coil 5 is connected between the pickup coils 7 divided and separated by the slits 9a. In addition, as shown in FIG. 2A, the trimming wire 6 is connected between the pickup coils 7 divided and separated by the slits 9a. Therefore, in the second embodiment, all input coils 5 are also shunted by the trimming wire 6.

Since the input coil 5 is a multi-turn coil having, for example, 20 turns as shown in FIG. 2B, an inductance $L_i$ of the input coil 5 is sufficiently larger than a inductance $L_w$ of the trimming wire 6 ($L_w \ll L_i$). Therefore, if a shielding current $I_p$ is generated in the pickup coil 7, the shielding current $I_p$ mainly flows in a closed loop L2 on the trimming wire side through the trimming wire 6, and hardly flows in a flux transformer (a closed loop on the input coil side) L1 through the input coil 5.

Figure 3:
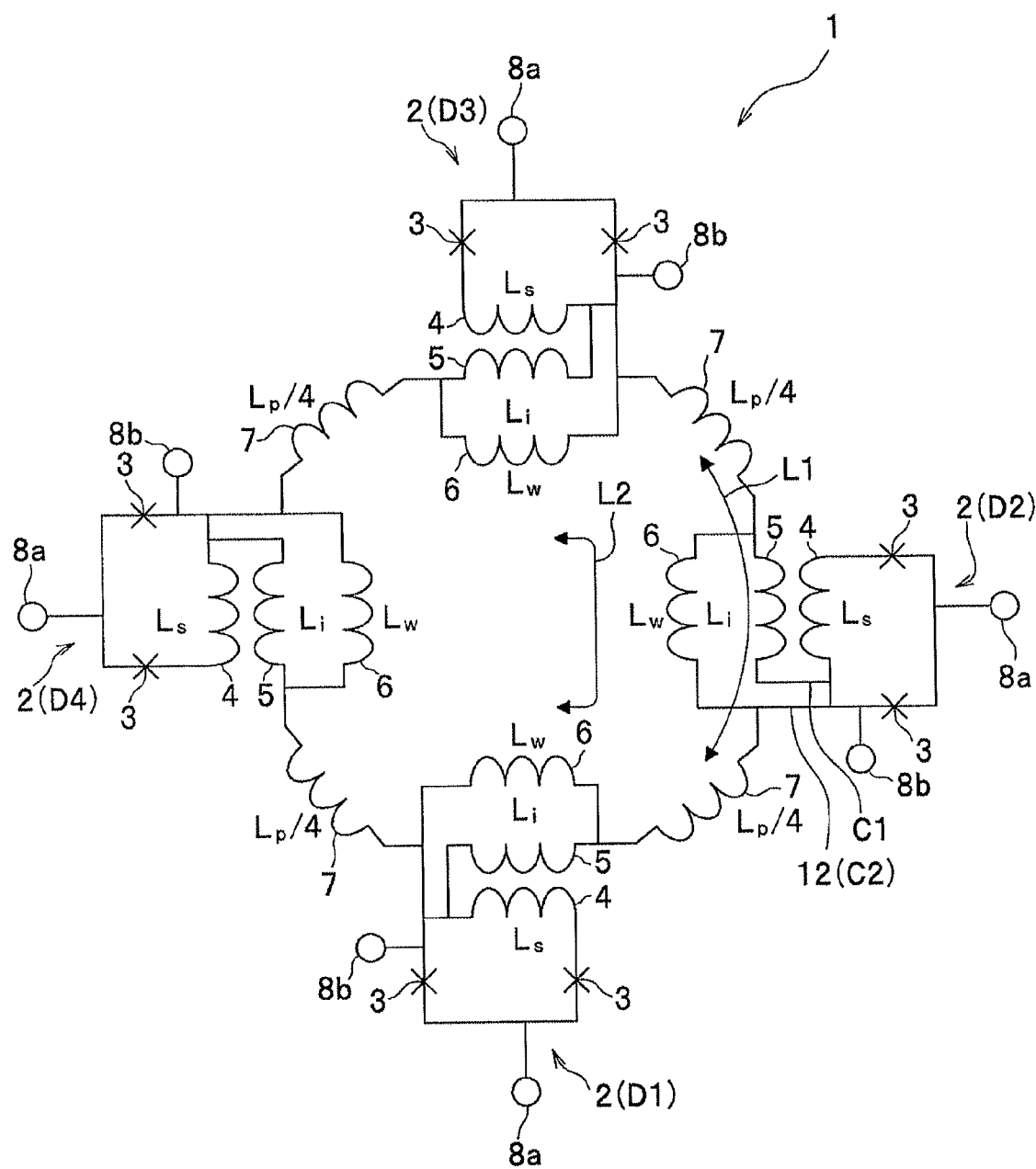
FIG. 3 is a circuit diagram of a HTS magnetic sensor (before a trimming wire is cut off) according to the second embodiment of the present invention.

An equivalent circuit diagram of the HTS magnetic sensor 1 according to the second embodiment of the present invention is shown in FIG. 3. FIG. 3 shows a status before the trimming wire 6 is cut off. The inductances $L_s$ of the four SQUID inductors 4, the inductances $L_i$ of the four input coils 5 and the inductances $L_w$ of the four trimming wires 6, are denoted by the same references $L_s$, $L_i$ and $L_w$, respectively, for convenience. However, each inductance of the inductances $L_s$, each inductance of the inductances $L_i$ and each inductance of the inductances $L_w$ may be designed to have a different value. With respect to the pickup coil 7, each of four equally-divided pickup coils is given an inductance $L_p/4$, which is 1/4 of the inductance $L_p$ of the pickup coil 7 and corresponds to the division into four. However, this is for easy understanding of correspondence between the plan view of the HTS magnetic sensor 1 and the equivalent circuit diagram, and the value is equivalent to the inductance $L_p$ of the pickup coil 7 shown in FIG. 1A of the first embodiment.

In addition, in the first embodiment (FIG. 1A), the SQUID inductor 4 is magnetically coupled with the input coil 5, but not connected to the input coil 5. However, in the second embodiment, as shown in FIG. 2B, the SQUID inductor 4 is connected to the input coil 5 through the contact hole C1, then, this connection is incorporated in the equivalent circuit diagram of FIG. 3. The coupling coefficient k of the magnetic coupling between the SQUID inductor 4 and the input coil 5 never decreases by this connection.

In addition, in the first embodiment (FIG. 1A), the SQUID inductor 4 is not connected to the trimming wire 6. However, in the second embodiment, as shown in FIG. 2B, the SQUID inductor 4 is connected to the trimming wire 6 through the contact hole C2, then, this connection is incorporated in the equivalent circuit diagram of FIG. 3. The trimming wire 6 is connected to the input coil 5 by this connection through the wiring 12 of the SQUID inductor 4 and the contact hole C1, and in this case, it is considered that the SQUID inductor 4 connected between the trimming wire 6 and the input coil 5 does not function as an inductance and merely functions as a wire.

In addition, in the second embodiment, a junction width of the Josephson junction 3 of each of the four integrated SQUIDs 2 (D1, D2, D3, D4) is set to 1.2 µm, 2.0 µm, 3.0 µm and 4.0 µm, respectively. With respect to the four integrated SQUIDs 2 (D1, D2, D3, D4), the inductances $L_s$ of the four SQUID inductors 4 are set to the same value of about 40 pH ($L_s$=about 40 pH), the inductances $L_i$ of the four input coils 5 are set to the same value of about 7 nH ($L_i$=about 7 nH) and the inductance $L_p$ of the pickup coil 7 is set to a value of about 10 nH ($L_p$=about 10 nH).

When a magnetic field is applied to the HTS magnetic sensor 1 whose trimming wire 6 is not cut off as shown in FIG. 3, the shielding current $I_p$ (see FIG. 2A) to be induced in the pickup coil 7 hardly flows into the input coil 5 that has a large inductance, and flows into the trimming wire 6 that has a smaller inductance. Since the shielding current $I_p$ hardly flows into any input coils 5, the HTS magnetic sensor 1 does not function as a high sensitive magnetic sensor under the foregoing condition. However, it is possible to evaluate a current-voltage characteristic of the integrated SQUID 2 (D1, D2, D3, D4). In addition, by applying a relatively high intensity magnetic field, a magnetic field response of the integrated SQUID 2, that is, a voltage-magnetic flux characteristic can be evaluated from a shielding current component flowing a little in the input coil 5 and a magnetic field component which directly interlinks with the integrated SQUID 2 (D1, D2, D3, D4). From the current-voltage characteristic and the voltage-magnetic field characteristic, electric and magnetic characteristics such as a critical current $I_c$, a junction resistance $R_n$ and a modulation voltage amplitude $\Delta V$ of each integrated SQUID 2 (D1, D2, D3, D4) can be measured (acquired), and based on the measurement results of these electric and magnetic characteristics, an integrated SQUID 2 (D1, D2, D3, D4) which is usable and suitable for the application can be selected. As a result, for example, the integrated SQUID 2 (D2) is selected.

After the integrated SQUID 2 (D2) is selected as an integrated SQUID 2 usable and suitable for the application, a trimming wire 6 making a short circuit between both ends of the input coil 5 which is connected to and/or magnetically coupled with the selected integrated SQUID 2 (D2) is cut off.

Figure 4:
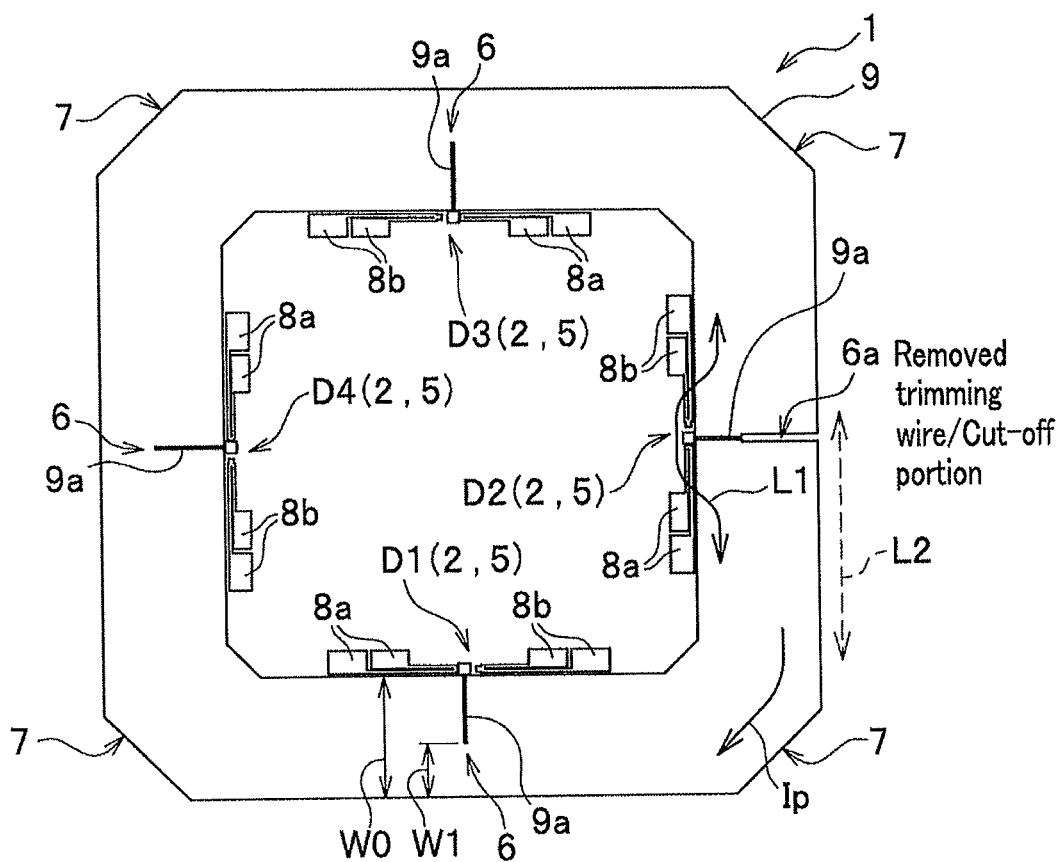
FIG. 4 is a plan view of a HTS magnetic sensor (after a trimming wire is cut off) according to the second embodiment of the present invention.
Figure 5:
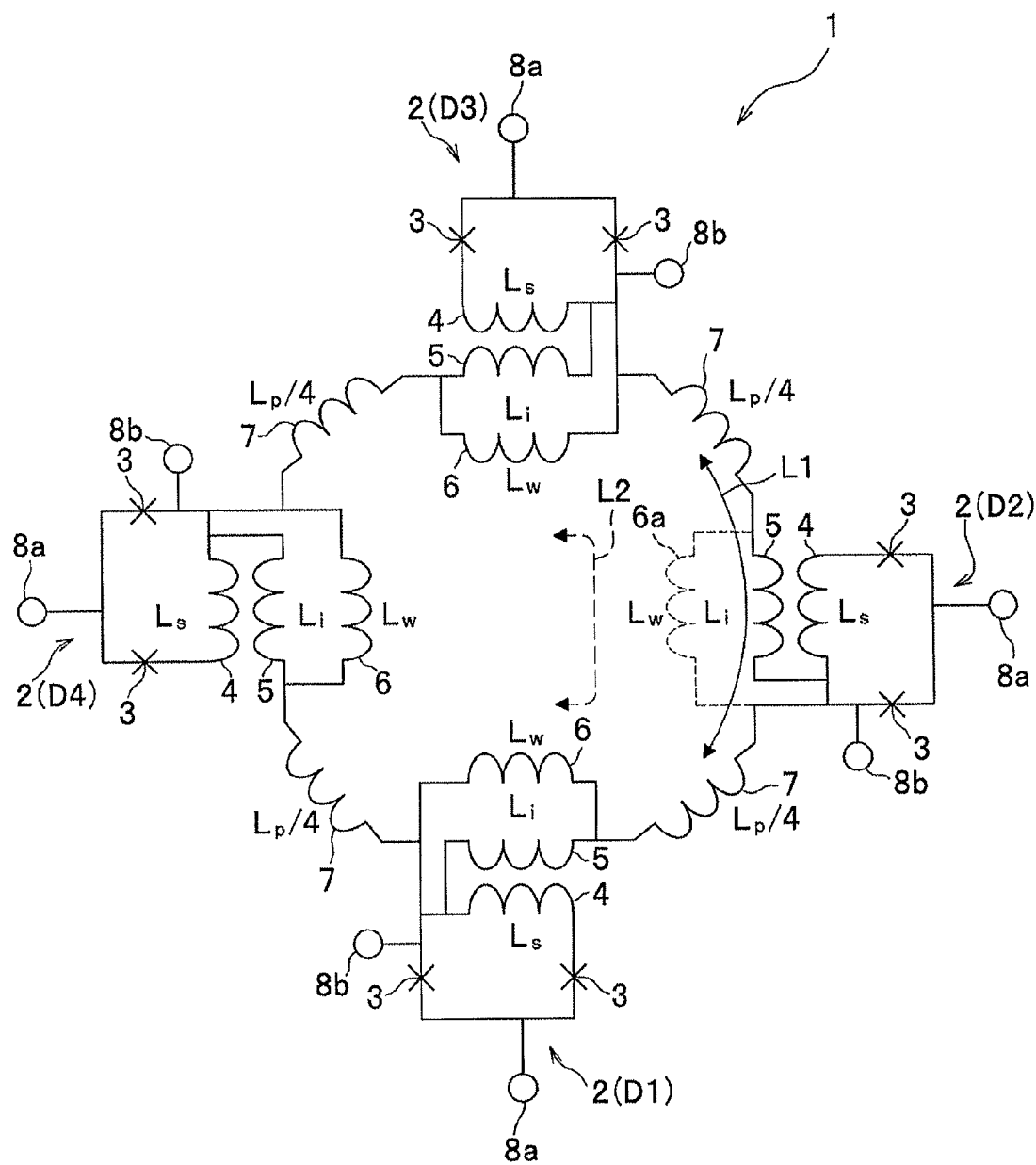
FIG. 5 is a circuit diagram of a HTS magnetic sensor (after a trimming wire is cut off) according to the second embodiment of the present invention.

FIG. 4 and FIG. 5 show the HTS magnetic sensor 1 where the trimming wire 6 making a short circuit between both ends of the input coil 5 which is connected to and/or magnetically coupled with the integrated SQUID 2 (D2) is cut off. A cut-off portion 6a is generated after the trimming wire 6 is cut off. The cut-off of the trimming wire 6 is conducted so that the cut-off portion 6a is generated from the slit 9a to the outer circumferential edge of the ring 9. The cut-off portion 6a neighbors to the slit 9a and continues from the slit 9a. The closed ring 9 opens by the cut-off portion 6a and the slit 9a. As a result, the closed loop L2 on the trimming wire side consisting of a plurality of trimming wires 6 and the pickup coil 7 opens by the cut-off portion 6a. On the other hand, the closed loop L1 on the input coil side consisting of a plurality of input coils 5 and the pickup coil 7 remains closed regardless of existence or non-existence of the cut-off portion 6a.

If a magnetic field is applied under the foregoing condition, since the shielding current $I_p$ flowing in the pickup coil 7 is not able to flow in the trimming wire 6 (a part of the loop L2) at the cut-off portion 6a, the shielding current $I_p$ flows in the input coil 5 (a part of the loop L1) which is connected to and/or magnetically coupled with the integrated SQUID 2 (D2) that is selected and used. Accordingly, the integrated SQUID 2 (D2) functions as a high sensitive SQUID magnetic sensor suitable for the application, thereby, the HTS magnetic sensor 1 functions as a high sensitive SQUID magnetic sensor suitable for the application. It is noted that in the integrated SQUIDs 2 (D1, D3, D4) other than the integrated SQUID 2 (D2), most of the shielding current $I_p$ flows in the trimming wire 6 that has a small inductance, as with the status before the trimming wire 6 is cut off.

Next, explanations will be given of a fabrication method of the HTS magnetic sensor 1 and measurement results thereof. In the fabrication of the HTS magnetic sensor 1, a HTS multilayer structure that includes two superconductor layers is fabricated.

Figure 6:
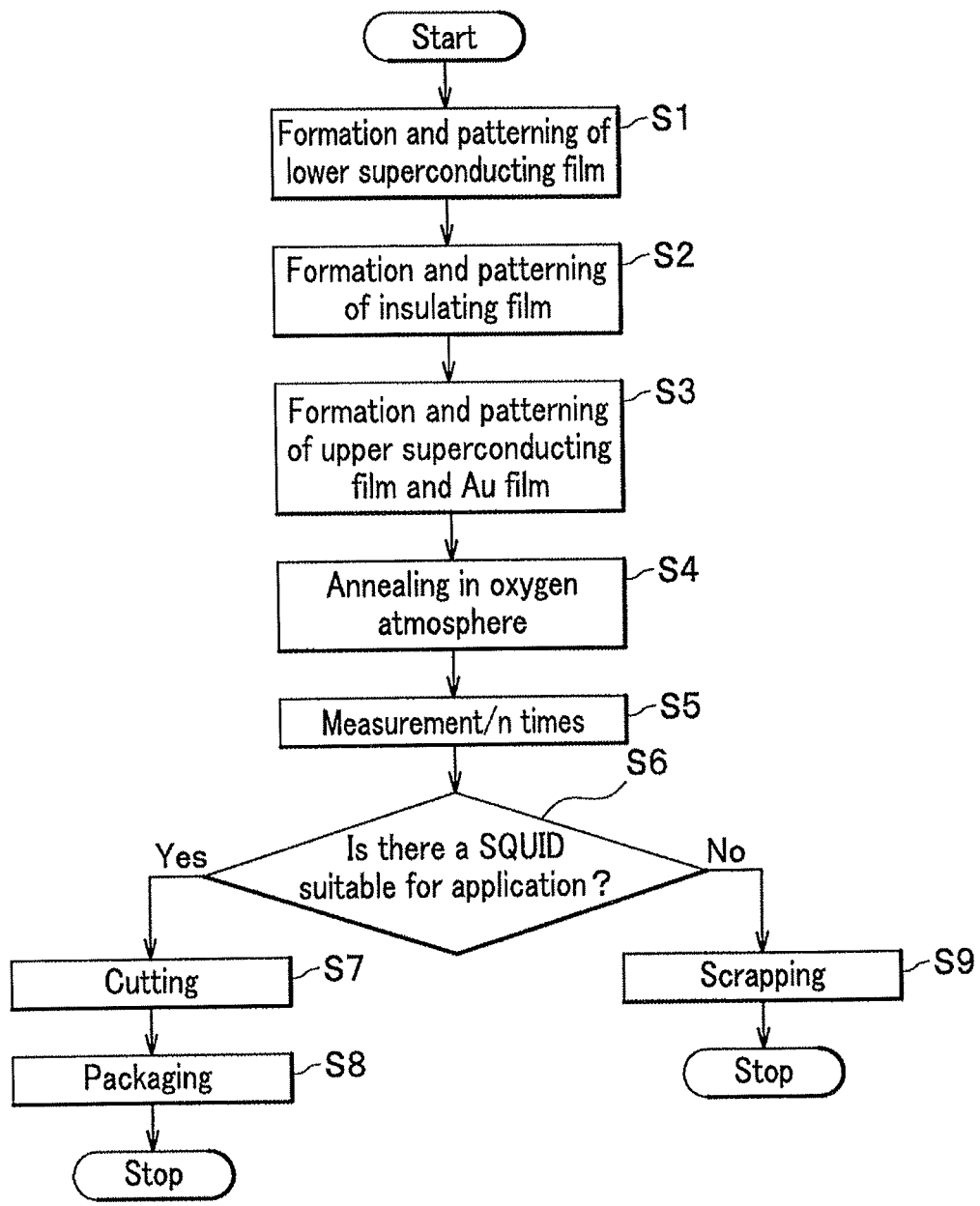
FIG. 6 is a flowchart of a fabrication method of a HTS magnetic sensor according to the second embodiment of the present invention.

A flowchart of a fabrication method of the HTS magnetic sensor 1 according to the second embodiment of the present invention is shown in FIG. 6. This flowchart describes only main steps, and the explanation of the fabrication method will be given by referring to cross sections of the HTS magnetic sensor 1 under fabrication shown in FIG. 7A to FIG. 7E. The explanation will return to the flowchart of FIG. 6 as appropriate.

Figure 7A:
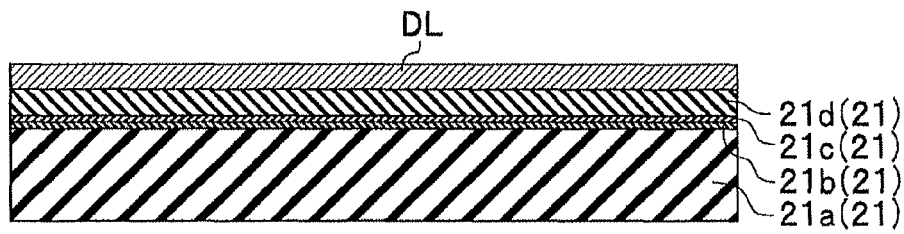
FIG. 7A to FIG. 7E are cross sectional views of a HTS magnetic sensor under fabrication according to the second embodiment of the present invention.

First, as shown in FIG. 7A, a substrate 21 that has a four-layer structure was fabricated. A magnesium oxide (MgO (100)) substrate 21a having a size of 15×15 mm$^2$ was prepared, and a BaZrO$_3$ layer having a film thickness of 5 nm as an orientation control buffer layer 21b, a Pr$_{1.4}$Ba$_{1.6}$Cu$_{2.6}$Ga$_{0.4}$O$_y$ layer having a film thickness of 300 nm as a black heat soaking layer 21c and a SrSnO$_3$ layer having a film thickness of 250 nm as a bottom insulating layer 21d, were sequentially formed and stacked on the magnesium oxide substrate 21a by off-axis sputtering.

Figure 7B:
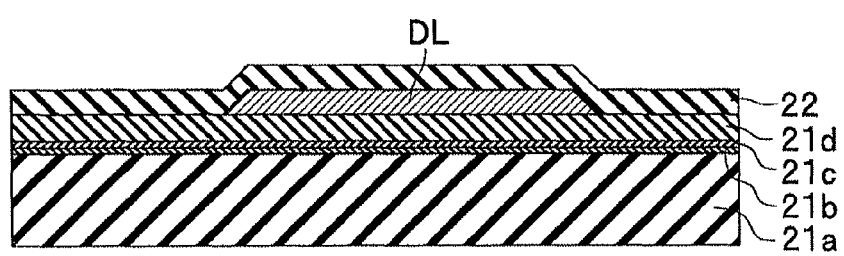

Next, as a step S1 of FIG. 6, a SmBa$_2$Cu$_3$O$_y$ (SmBCO) layer having a film thickness of 250 nm was formed on the substrate 21 by off-axis sputtering as a lower superconductor layer (first superconductor layer) DL. Then, as shown in FIG. 7B, the lower superconductor layer (first superconductor layer) DL was patterned so as to have a desired circuit pattern (for example, a pattern of the SQUID inductor 4). Photolithography and dry etching by ion milling were used for forming the circuit pattern.

Figure 7C:
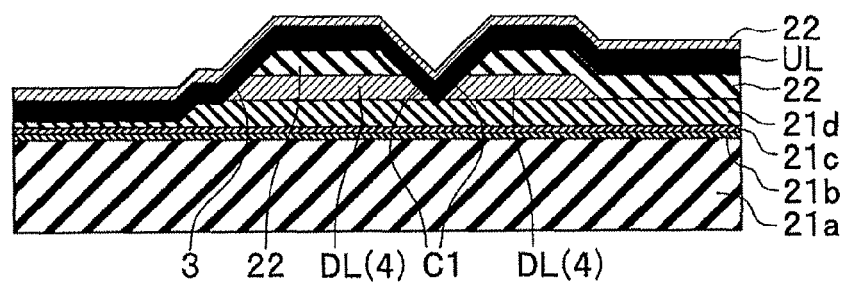

Next, as a step S2 of FIG. 6, as shown in FIG. 7B, a SrSnO$_3$ (SSO) layer having a film thickness of 280 nm was formed by off-axis sputtering as an interlayer insulating layer (insulating layer) film 22. Then, as shown in FIG. 7C, the interlayer insulating layer film 22 was patterned so as to have a desired circuit pattern. Photolithography and dry etching by ion milling were used for forming the circuit pattern. By the etching of the interlayer insulating layer film 22, a ramp slope for the ramp-edge Josephson junction 3 and a ramp slope for, for example, the contact hole C1 for connecting the lower superconducting layer (first superconducting layer) DL and an upper superconducting layer (second superconducting layer) UL were formed in the interlayer insulating layer film 22 and in the lower superconducting layer (first superconducting layer) DL. Namely, in the etching, the lower superconducting layer (first superconducting layer) DL was concurrently etched with the interlayer insulating layer film 22.

Figure 7D:
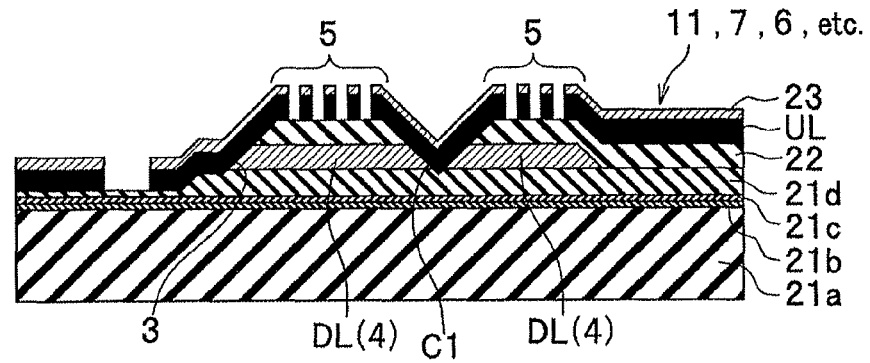

Next, as a step S3 of FIG. 6, as shown in FIG. 7C, a $La_{0.1}$—$Er_{0.95}Ba_{1.95}Cu_3O_y$ (L1ErBCO) layer having a film thickness of 250 nm was formed by laser ablation as an upper superconducting layer (second superconducting layer) UL. When the upper superconducting layer (second superconducting layer) UL is formed on the ramp slope of the lower superconducting layer (first superconducting layer) DL of the ramp-edge Josephson junction 3, the ramp-edge Josephson junction 3 is completed. When the upper superconducting layer (second superconducting layer) UL is formed on the ramp slope, for example, on the contact hole C1, of the lower superconducting layer (first superconducting layer) DL, the lower superconducting layer (first superconducting layer) DL and the upper superconducting layer (second superconducting layer) UL are connected. In addition, a gold layer having a film thickness of 100 nm was formed on the upper superconducting layer (second superconducting layer) UL by sputtering as a gold (Au) electrode layer 23. Then, as shown in FIG. 7D, the gold electrode layer 23 and the upper superconducting layer (second superconducting layer) UL were patterned so as to have a desired circuit pattern (for example, a pattern of an input coil 5, a pickup coil 7 and a trimming wire 6). In addition, a junction width of the ramp-edge Josephson junction 3 was varied for each of the four integrated SQUIDs (D1, D2, D3, D4), and set to 1.2 µm 2.0 µm, 3.0 µm and 4.0 µm, respectively. Photolithography and dry etching by ion milling were used for forming the circuit pattern. In order to concurrently etch the upper superconducting layer (second superconducting layer) UL and the gold electrode layer 23, a surface of the upper superconducting layer (second superconducting layer) UL was entirely covered by the gold electrode layer 23.

Next, as a step S4 of FIG. 6, the HTS magnetic sensor 1 was annealed at 400 to 500° C. in oxygen atmosphere at 1 atm. Though the foregoing fabrication steps, the HTS magnetic sensor 1 before the trimming wire 6 is cut off as shown in FIG. 2A was completed.

Next, as a step 5 of FIG. 6, a measurement is conducted n times that is identical to the number of integrated SQUIDs 2 (four integrated SQUIDs in the second embodiment) formed in the HTS magnetic sensor 1. That is, the measurement is conducted for all integrated SQUIDs 2 formed in the HTS magnetic sensor 1. As a measurement, a measurement of current-voltage characteristic and a measurement of voltage-magnetic flux characteristic were conducted for each of the four integrated SQUIDs 2 at a temperature of 77 K. In the measurement, the HTS magnetic sensor 1 was immersed in liquid nitrogen for cooling.

Figure 8A:
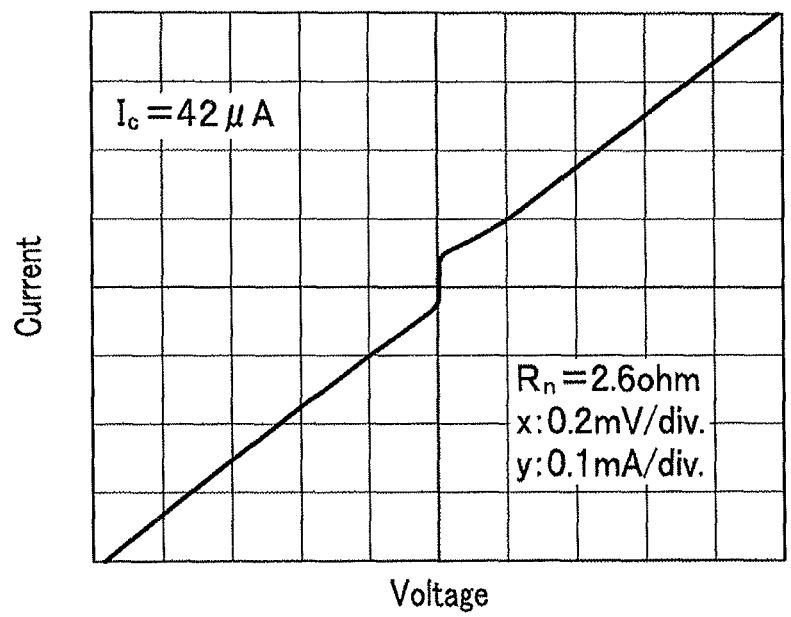
FIG. 8A is a current-voltage characteristic of a superconducting quantum interference device (SQUID) among a plurality of SQUIDs disposed in a HTS magnetic sensor (before a trimming wire is cut off) according to the second embodiment of the present invention.

In FIG. 8A, a measurement result of the current-voltage characteristic of one integrated SQUID 2 (D2, junction width $w_j$=2.0 µm) among the four integrated SQUIDs 2 (D1, D2, D3, D4) is shown. The current-voltage characteristic of the integrated SQUID 2 (D2) showed an RSJ-like non-linear characteristic that is typical in favorable Josephson characteristics. The critical current $I_c$ was 42 µA and the junction resistance $R_n$ was 2.6Ω (ohm).

Figure 8B:
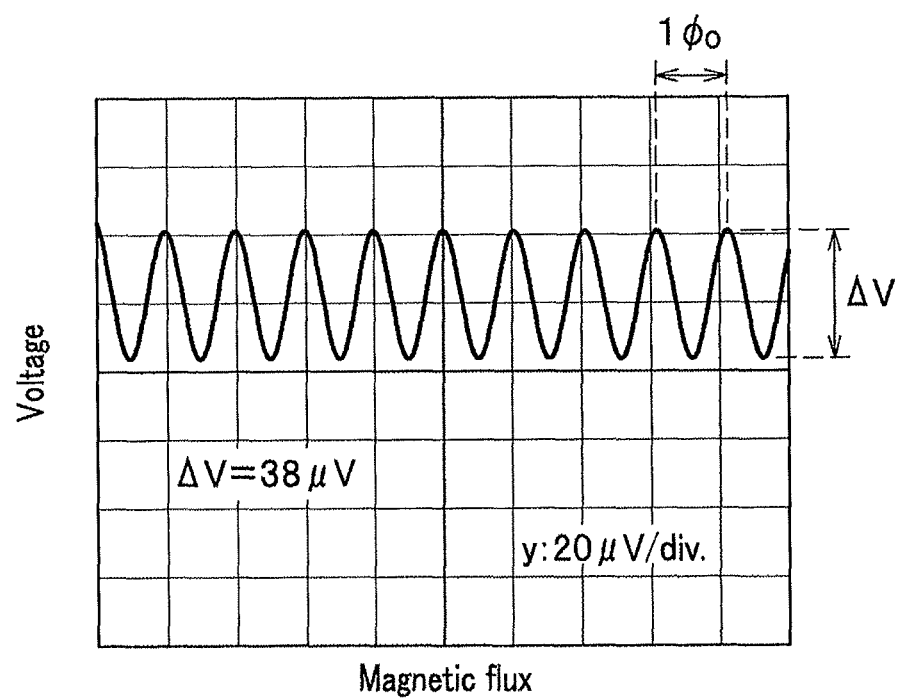
FIG. 8B is a voltage-magnetic flux characteristic of a superconducting quantum interference device (SQUID) among a plurality of SQUIDs disposed in a HTS magnetic sensor (before a trimming wire is cut off) according to the second embodiment of the present invention.

In FIG. 8B, a measurement result of the voltage-magnetic flux characteristic of one integrated SQUID 2 (D2, junction width $w_j$=2.0 µm) among the four integrated SQUIDs 2 (D1, D2, D3, D4) is shown. The voltage-magnetic flux characteristic of the integrated SQUID 2 (D2) showed a periodic variation specific to a SQUID. The modulation voltage amplitude ΔV was 38 µV. As described above, even if the input coil 5 is shunted by the trimming wire 6, the basic characteristics of each integrated SQUID 2 (D1, D2, D3, D4) can be measured, and thereby an integrated SQUID 2 suitable for the application can be selected based on the measurement results. Meanwhile, if a SQUID that satisfies specifications of the application was found, it may be possible to proceed to the next step before completing the measurement for all SQUIDs.

Next, as a step S6 of FIG. 6, a plurality of integrated SQUIDs 2 (D1, D2, D3, D4) are evaluated and a SQUID 2 which is suitable for the application is selected.

In Table 1, measurement results (measurement temperature: 77 K) of the four integrated SQUIDs 2 (D1(SQUID-1), D2(SQUID-2), D3(SQUID-3), D4(SQUID-4)) are shown. The four integrated SQUIDs 2 (D1, D2, D3, D4) were all proper and demonstrated to work well. In the example of the second embodiment, since the SQUID was assumed to be used at a temperature of 77 K in the application, an integrated SQUID 2 (D2) that has a large modulation voltage amplitude ΔV and an appropriate critical current $I_c$ was selected (step S6: Yes), and the step proceeded to a step S7. On the other hand, if the four integrated SQUIDs 2 (D1, D2, D3, D4) were all defective (step S6: No), the step proceeds to a step S9 and the HTS magnetic sensor 1 is scrapped, and the fabrication method of the second embodiment is terminated.

TABLE 1

Measured Values of Four SQUIDs

| SQUID | $I_c$ (µA) | $R_n$ (Ω) | ΔV (µV) |
|---|---|---|---|
| SQUID-1 (D1) | 110 | 1.3 | 23 |
| SQUID-2 (D2) | 42 | 2.6 | 38 |
| SQUID-3 (D3) | 30 | 2.9 | 34 |
| SQUID-4 (D4) | 210 | 0.77 | 22 |

Figure 7E:
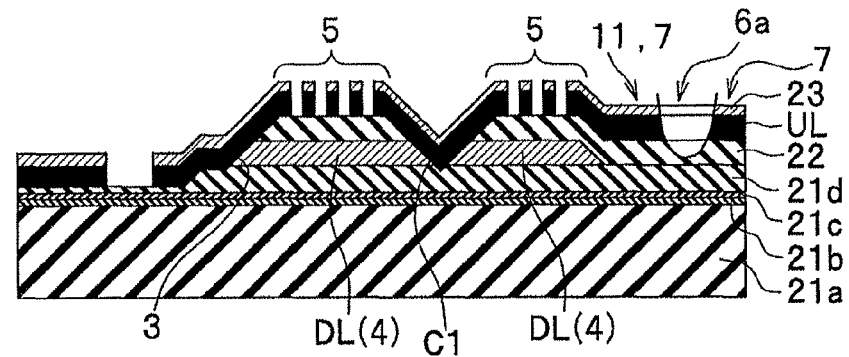

Next, as a step S7, as shown in FIG. 4 and FIG. 7E, the trimming wire 6 is cut off to generate the cut-off portion 6a. A trimming wire 6 which connects both ends of an input coil 5 that is magnetically coupled with the integrated SQUID 2 (D2) selected in the step S6 is cut off. The foregoing photolithography and etching can be used for cutting off the trimming wire 6. However, in the embodiment, since the structure was designed so that the trimming wire 6 can be seen visually or with a stereomicroscope, the trimming wire 6 was cut off manually under observation of the stereomicroscope using a diamond cutter. In the cutting, the second superconducting layer UL where the trimming wire 6 is formed is cut off.

Since the foregoing cutting can be conducted easily and inexpensively without using a special tool, the cutting work can be implemented at the end user. Off course, before the cutting, the selection of a SQUID from the plurality of SQUIDs 2 (D1, D2, D3, D4) and the measurement of the plurality of SQUIDs 2 (D1, D2, D3, D4) can also be implemented at the end user. In addition, it is convenient if a measurement result is attached to the HTS magnetic sensor 1 so that the end user can select a SQUID without conducting the measurement.

Finally, as a step S8 of FIG. 6, the HTS magnetic sensor 1 was packaged. There were no big differences of the critical current $I_c$ and the modulation voltage amplitude $\Delta V$ of the integrated SQUID 2 (D2) before and after the packaging (cutting). The $A_{eff}$ that indicates a detection efficiency of the magnetic sensor was 2.0 mm$^2$. This value is nearly equal to the effective area (1.7 to 2.1=$^2$) of the HTS magnetic sensor including only one integrated SQUID 2 that was conventionally fabricated, and it was demonstrated that the detection efficiency, that is, the detection sensitivity is not degraded by the present invention.

Figure 9:
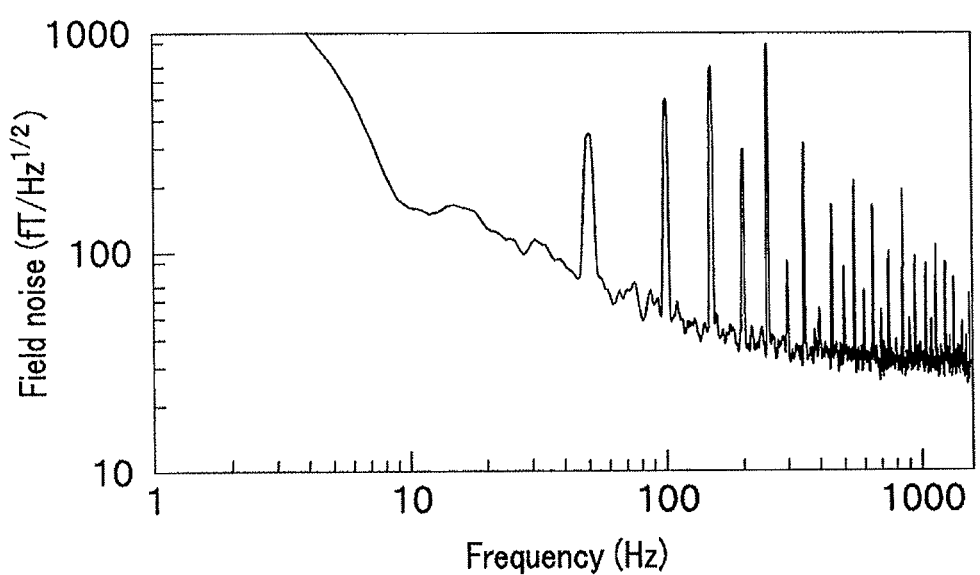
FIG. 9 is a noise characteristic of a HTS magnetic sensor (after a trimming wire is cut off) according to the second embodiment of the present invention.

A magnetic field noise of the HTS magnetic sensor 1 after the cutting of the trimming wire is shown in FIG. 9. As seen from FIG. 9, an excellent noise characteristic of about 30 fT/Hz$^{1/2}$ was obtained in the white area (space).

In the second embodiment, the integrated SQUID 2 (D2) was selected assuming that the integrated SQUID 2 (D2) is used at 77 K. However, when the integrated SQUID 2 (D2) is cooled utilizing thermal conduction, a temperature of the integrated SQUID 2 (D2) in operation may become higher than 77 K. When the temperature in operation increases, it is forecasted that the critical current $I_c$ decreases. Therefore, in this case, an integrated SQUID 2 that has a larger critical current $I_c$ may be selected. For example, the SQUID 2 (D1) or the SQUID 2 (D4) in Table 1 is selected.

In addition, a trial fabrication of the HTS magnetic sensor 1 according to the second embodiment was conducted several times, and in any cases, at least one of the integrated SQUIDs 2 has an adequate critical current $I_c$ and an adequate modulation voltage amplitude $\Delta V$. Namely, in any trial fabrication, a proper and usable device could be obtained. From the results described above, it was demonstrated that the present invention is highly effective for improving the fabrication yield of the HTS magnetic sensor.

(Third Embodiment)

Figure 10A:
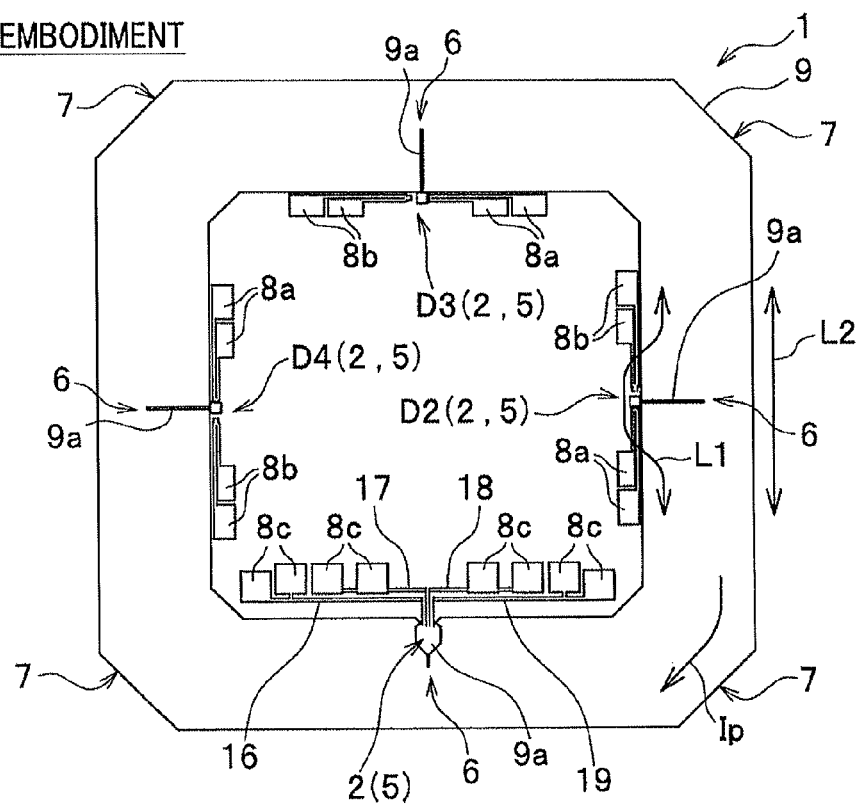
FIG. 10A is a plan view of a HTS magnetic sensor (before a trimming wire is cut off) according to a third embodiment of the present invention.
Figure 10B:
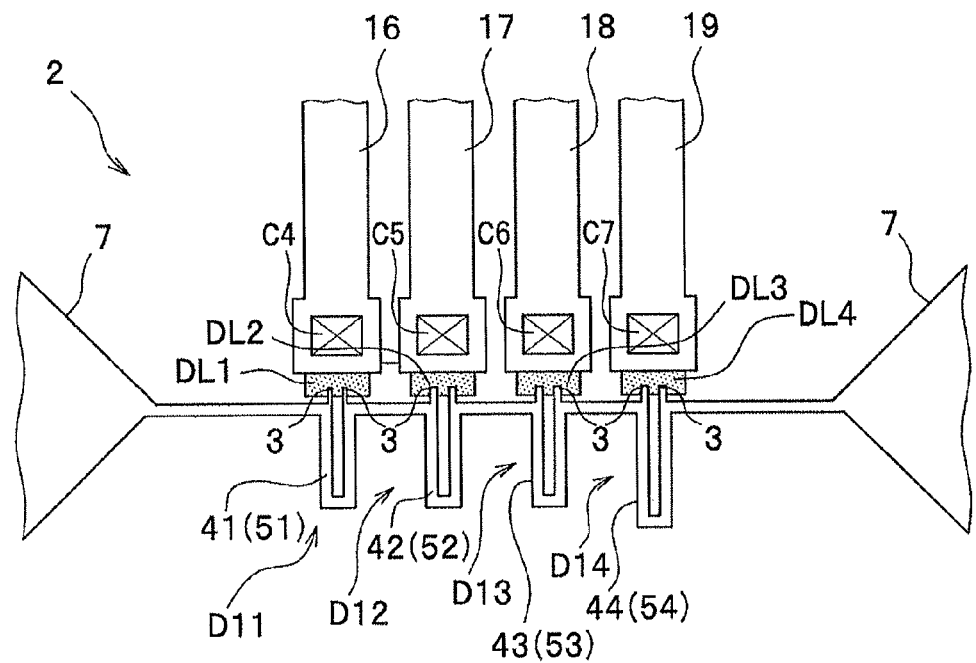
FIG. 10B is an enlarged view around a SQUID arranged at a bottom side of FIG. 10A.

A plan view of the HTS magnetic sensor 1 according to a third embodiment of the present invention is shown FIG. 10A, and FIG. 10B is an enlarged view around the SQUID 2 which is arranged on the bottom side of the HTS magnetic sensor 1 of FIG. 10A. FIG. 10A shows a status before the trimming wire 6 is cut off. In the third embodiment, an integrated SQUID 2 (D2, D3, D4) and a directly-coupled SQUID 2 (D11, D12, D13, D14), which have different structures to each other, are mixedly fabricated in the same HTS magnetic sensor 1.

The third embodiment is identical to the second embodiment except that the integrated SQUID 2 (D1) which is arranged at the center of the bottom side of the pickup coil 7 (ring 9) in the second embodiment was replaced by a plurality (four in FIG. 10B) of directly-coupled SQUIDs 2 (D11, D12, D13, D14).

As shown in FIG. 10B, the four directly-coupled SQUIDs 2 (D11, D12, D13, D14) are connected in series and both ends thereof are connected to the pickup coil 7 in series. The HTS magnetic sensor 1 according to the third embodiment can also be fabricated using the fabrication method described in the second embodiment.

In the directly-coupled SQUIDs 2 (D11, D12, D13, D14), the pickup coil 7 (inductance $L_p$) is directly connected to a serial connection of slit-hole type SQUID inductors 41, 42, 43, 44 (inductance $L_a$), and the SQUID inductors 41, 42, 43, 44 (inductance $L_s$) function as input coils 51, 52, 53, 54, respectively, thereby resulting in omission of the input coils 51, 52, 53, 54. Namely, a shielding current $I_p$ to be induced by a magnetic flux which interlinks with the pickup coil 7 (inductance $L_p$) directly flows in the SQUID inductors 41, 42, 43, 44 (inductance $L_s$). In the directly-coupled SQUIDs 2 (D11, D12, D13, D14), an inductance $L_i$ of the input coils 51, 52, 53, 54 is equal to the inductance $L_s$ of the SQUID inductors 41, 42, 43, 44 because the SQUID inductors 41, 42, 43, 44 are same as the input coils 51, 52, 53, 54 ($L_i=L_s$). Since the inductance $L_p$ of the pickup coil 7 is several nH to several tens nH, the inductance $L_p$ of the pickup coil 7 is much larger than the inductance $L_s$ of the SQUID inductors 41, 42, 43, 44 ($L_p \gg L_s$).

In the third embodiment, the integrated SQUID 2 (D2, D3, D4) can be selected and used for the application that requires an integrated SQUID, and the directly-coupled SQUID 2 (D11, D12, D13, D14) can be selected and used for the application that requires a directly-coupled SQUID. Since just one SQUID among the four directly-coupled SQUIDs 2 (D11, D12, D13, D14) is used, a fabrication of a plurality of directly-coupled SQUIDs is not necessarily required. However, there are advantages in improving the yield and in selecting a SQUID having optimum characteristics, if the plurality of directly-coupled SQUIDs are fabricated. For example, in the three directly-coupled SQUIDs 2 (D11, D12, D13), the inductances $L_s$ of the SQUID inductors 41, 42, 43 are the same and the value is 40 pH, and junction widths of the Josephson junctions 3 are 2, 3 and 4 μm, respectively. In the directly-coupled SQUID 2 (D14), an inductance $L_s$ of the SQUID inductor 44 is 50 pH, and a junction width of the Josephson junction 3 is 3 μm. As described above, design parameters were varied between the three directly-coupled SQUIDs 2 (D11, D12, D13) and the directly-coupled SQUID 2 (D14)

In the directly-coupled SQUID 2 (D11), the first superconducting layer DL1 where two Josephson junctions 3 are formed is connected to a wiring 16 which is connected to an electrode 8*c* (see FIG. 10A) formed on the second superconducting layer UL through a contact hole C4. Similarly, in the directly-coupled SQUID 2 (D12), the first superconducting layer DL2 where two Josephson junctions 3 are formed is connected to a wiring 17 which is connected to the electrode 8*c* (see FIG. 10A) formed on the second superconducting layer UL through a contact hole C5. In the directly-coupled SQUID 2 (D13), the first superconducting layer DL3 where two Josephson junctions 3 are formed is connected to a wiring 18 which is connected to the electrode 8*c* (see FIG. 10A) formed on the second superconducting layer UL through a contact hole C6. In the directly-coupled SQUID 2 (D14), the first superconducting layer DL4 where two Josephson junctions 3 are formed is connected to a wiring 19 which is connected to the electrode 8*c* (see FIG. 10A) formed on the second superconducting layer UL through a contact hole C7.

When the directly-coupled SQUID 2 (D11, D12, D13, D14) is selected and even if the trimming wire 6 is cut off, it is necessary to select and use a directly-coupled SQUID 2 (D11, D12, D13, D14) suitable for the application from the four directly-coupled SQUIDs 2 (D11, D12, D13, D14). In order to use the selected directly-coupled SQUID, it is sufficient if an external measurement instrument is connected to the electrode 8*c* which is connected to one of the wirings 16 to 19 that is connected to the selected directly-coupled SQUID.

According to the third embodiment, an integrated SQUID which is excellent in sensitivity or a directly-coupled SQUID which hardly causes the magnetic flux trap and has a wide dynamic range can be selected and used depending on the application within a single HTS magnetic sensor. Namely, a HTS magnetic sensor having versatility can be provided.

(Fourth Embodiment)

Figure 11A:
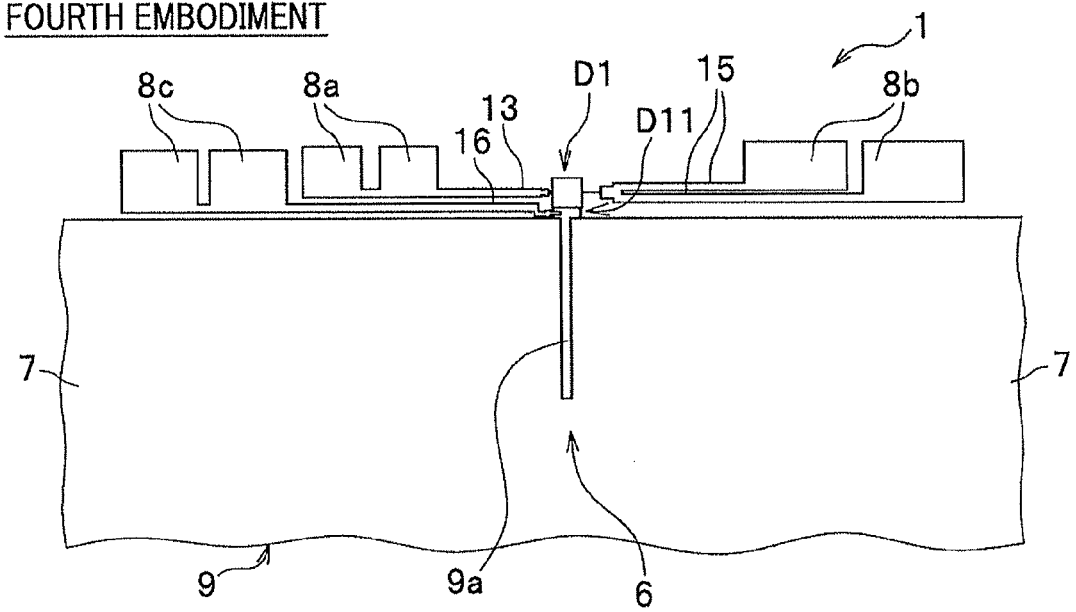
FIG. 11A is an enlarged view around a SQUID D1 of a HTS magnetic sensor (before a trimming wire is cut off) according to a fourth embodiment of the present invention.
Figure 11B:
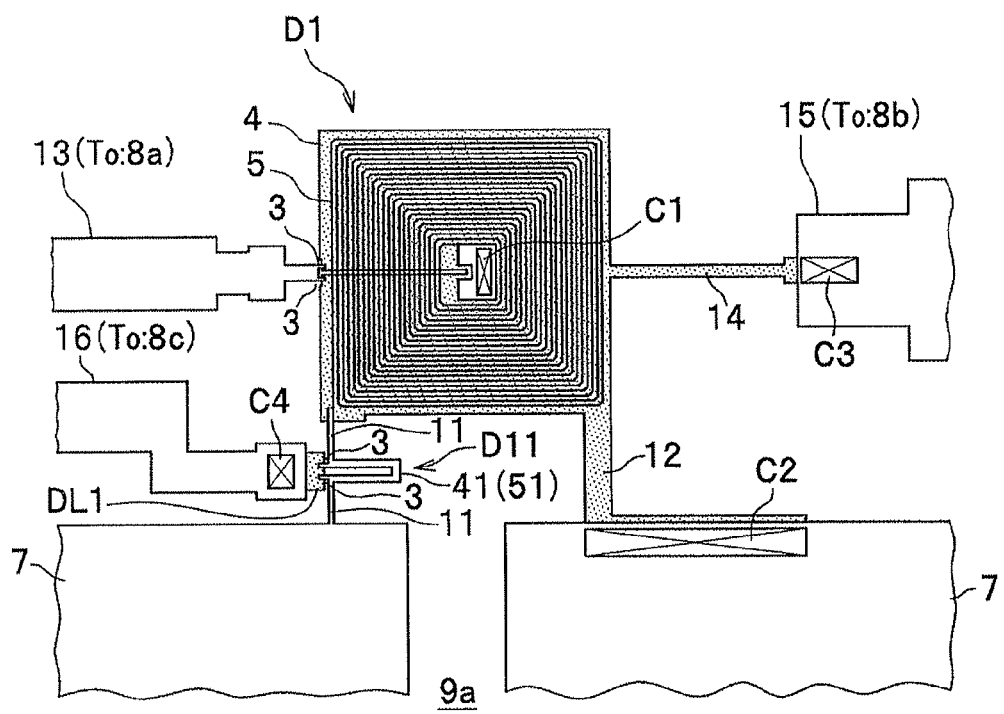
FIG. 11B is an enlarged view around a SQUID D1 of FIG. 11A.

A plan view around an integrated SQUID 2 (D1) of the HTS magnetic sensor 1 according to a fourth embodiment of the present invention is shown in FIG. 11A, and an enlarged view around the SQUID 2 (D1) of FIG. 11A is shown in FIG. 11B. FIG. 11A shows a status before the trimming wire 6 is cut off. In the fourth embodiment, an integrated SQUID 2 (D1) and a directly-coupled SQUID 2 (D11), which have different structures to each other, are also mixedly fabricated in the HTS magnetic sensor 1.

The HTS magnetic sensor 1 according to the fourth embodiment may be considered such that a SQUID inductor 41 of the directly-coupled SQUID 2 (D11) according to the third embodiment is connected in series between the wirings 11 of the HTS magnetic sensor 1 according to the second embodiment, which was used as a base. The wiring 11 is connected to the input coil (first input coil) 5 of the integrated SQUID 2 (D1), and the SQUID inductor 41 connected to the wiring 11 has a function as an input coil (second input coil) 51 of the directly-coupled SQUID 2 (D11). Therefore, it can be considered that the input coil (first input coil) 5 is connected to the input coil (second input coil) 51 in series. One end of this serial connection is connected to the pickup coil 7 through the wiring 11, and the other end is connected to the pickup coil 7 through the contact hole C1 and the wiring 12. Therefore, the flux transformer (a closed loop on the input coil side) L1 is formed by the input coil 5, the input coil 51 and the pickup coil 7.

This serial connection may be disposed in other integrated SQUIDs 2 (D2, D3, D4) in addition to the integrated SQUID 2 (D1). The HTS magnetic sensor 1 according to the fourth embodiment can also be fabricated using the fabrication method described in the second embodiment.

According to the fourth embodiment, since the integrated SQUID 2 (for example, D1) and the directly-coupled SQUID 2 (for example, D11) are both usable even if the trimming wire 6 is cut off by the selection, a wide and highly sensitive magnetic signal measurement can be conducted by only switching the electrodes 8a to 8c corresponding to the SQUID.

In addition, in the fourth embodiment, if the flux transformer (a closed loop on the input coil side) L1 is formed by the input coil 5, the input coil 51 and the pickup coil 7, the trimming wire 6 is unnecessary because the integrated SQUID 2 (D1) and the directly-coupled SQUID 2 (D11) can be selected and used by switching the electrodes 8a to 8c, even if there is no trimming wire 6.

(Fifth Embodiment)

Figure 12A:
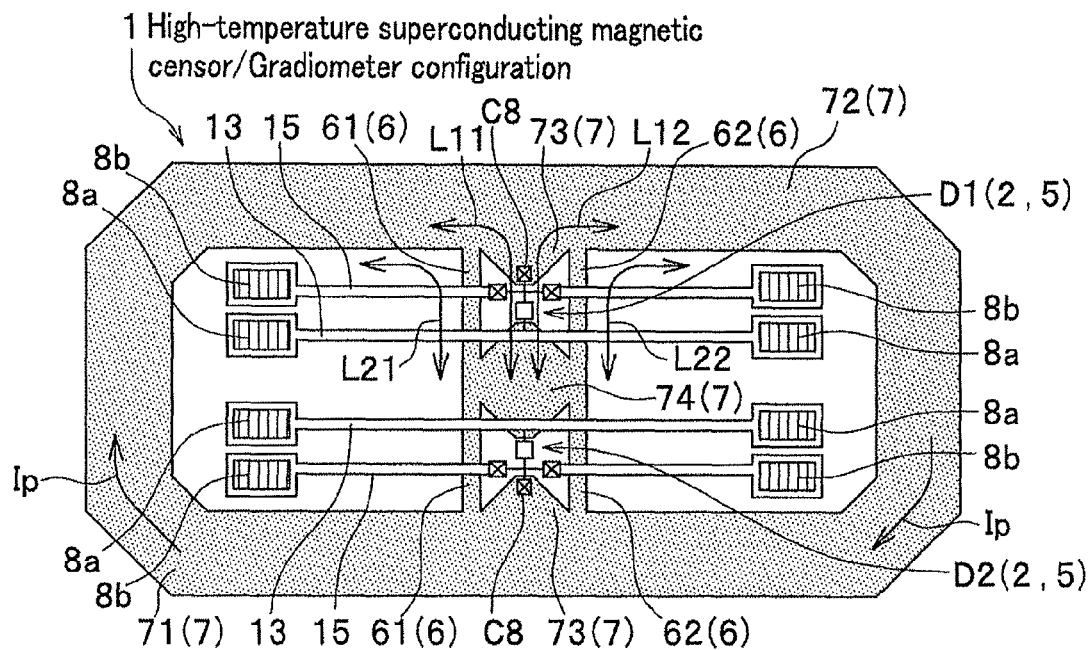
FIG. 12A is a plan view of a HTS magnetic sensor (a gradiometer configuration, before a trimming wire is cut off) according to a fifth embodiment of the present invention.

A plan view of the HTS magnetic sensor (gradiometer configuration) 1 according to a fifth embodiment of the present invention is shown in FIG. 12A. FIG. 12A shows a status before the trimming wire 6 (61, 62) is cut off. In the fifth embodiment, an explanation will be given of the case that the present invention is applied to the gradiometer. In the fifth embodiment, elements are identical to those of the first to the fourth embodiments, and a same reference is given to the same element in order to skip the explanation thereof, and for easy understanding.

In the HTS magnetic sensor (gradiometer configuration) 1, a plurality (two in FIG. 12A) of integrated SQUIDs 2 (D1, D2) are connected in series, and the serial connection is connected to a planar first-order gradiometric pickup coil (pickup coil) 7 in series.

The planar first-order gradiometric pickup coil (pickup coil) 7 consists of two pickup coils on the right and left that are a pickup coil (first pickup coil) 71(7) and a pickup coil (second pickup coil) 72(7). The two pickup coils 71(7) and coil 72(7) on the right and left are arranged side-by-side, while sandwiching the input coils 5 of the integrated SQUIDs 2 (D1, D2) between the pickup coil 71(7) and the pickup coil 72(7).

The pickup coil 71(7) on the left forms a flux transformer (a closed loop on the input coil side) L11 (L1) by sequentially passing though a top and bottom portion 73(7) at the center of the upper pickup coil, a contact hole C8, the pickup coil 5 of the integrated SQUID 2 (D1), a center portion 74(7) of the pickup coil, the input coil 5 of the integrated SQUID 2 (D2), the contact hole C8 and a top and bottom portion 73 (7) at the center of the lower pickup coil. Similarly, the pickup coil 72(7) on the right forms a flux transformer (a closed loop on the input coil side) L12 (L1) by sequentially passing though the top and bottom portion 73(7) at the center of the upper pickup coil, the contact hole C8, the pickup coil 5 of the integrated SQUID 2 (D1), the center portion 74 (7) of the pickup coil, the input coil 5 of the integrated SQUID 2 (D2), the contact hole C8 and the top and bottom portion 73 (7) at the center of the lower pickup coil.

Trimming wires 61(6) and 62(6) are disposed on the right and left sides (of the input coil 5) of the integrated SQUID (D1). The trimming wire (first trimming wire) 61(6) is disposed on the side of the pickup coil 71 (7) (of the input coil 5) of the integrated SQUID 2 (D1), and the trimming wire (second trimming wire) 62(6) is disposed on the side of the pickup coil 72 (7) (of the input coil 5) of the integrated SQUID 2 (D1). The trimming wires 61(6) and 62(6) are also disposed on the right and left sides (of the input coil 5) of the integrated SQUID 2 (D2). The trimming wire (first trimming wire) 61(6) is disposed on the side of the pickup coil 71 (7) (of the input coil 5) of the integrated SQUID 2 (D2), and the trimming wire (second trimming wire) 62(6) is disposed on the side of the pickup coil 72 (7) (of the input coil 5) of the integrated SQUID 2 (D2). The trimming wires 61(6) and 62(6) connect between the top and bottom portion 73(7) at the center of the pickup coil and the center portion 74(7) of the pickup coil. Then, (the input coil 5 of) the integrated SQUID 2 (D1, D2) and the trimming wires 61(6), 62(6) are connected in parallel between the top and bottom portion 73(7) at the center of the pickup coil and the center portion 74(7) of the pickup coil. Namely, both ends (of the input coil 5) of the integrated SQUID 2 (D1, D2) are shunted by each of the trimming wires 61(6) and 62(6). Meanwhile, the trimming wires 61(6) and 62(6) are formed on both the right and left of the integrated SQUID 2 (D1, D2) in order to keep a geometric balance between the pickup coil 71(7) and the pickup coil 72(7) on the right and left. In addition, the electrodes 8a and 8b are also arranged so as to keep the foregoing geometric balance.

The pickup coil 71(7) on the left forms a closed loop L21 (L2) on the trimming wire side by sequentially passing though the top and bottom portion 73(7) at the center of the upper pickup coil, an upper trimming wire 62(6), the center portion 74(7) of the pickup coil, a lower trimming wire 62(6) and the top and bottom portion 73(7) at the center of the lower pickup coil. Similarly, the pickup coil 72(7) on the right forms a closed loop L22 (L2) on the trimming wire side by sequentially passing though the top and bottom portion 73(7) at the center of the upper pickup coil, an upper trimming wire 61(6), the center portion 74(7) of the pickup coil, a lower trimming wire 61(6) and the top and bottom portion 73(7) at the center of the lower pickup coil.

Figure 12B:
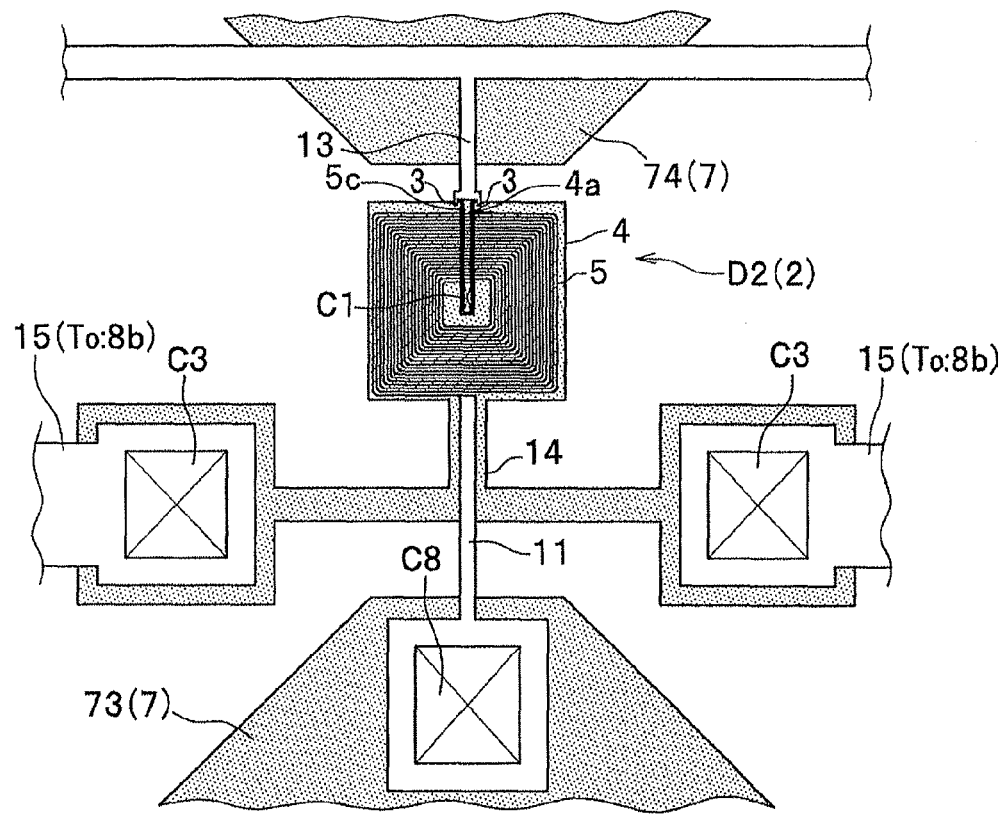
FIG. 12B is an enlarged view around the SQUID of FIG. 12A.
Figure 12C:
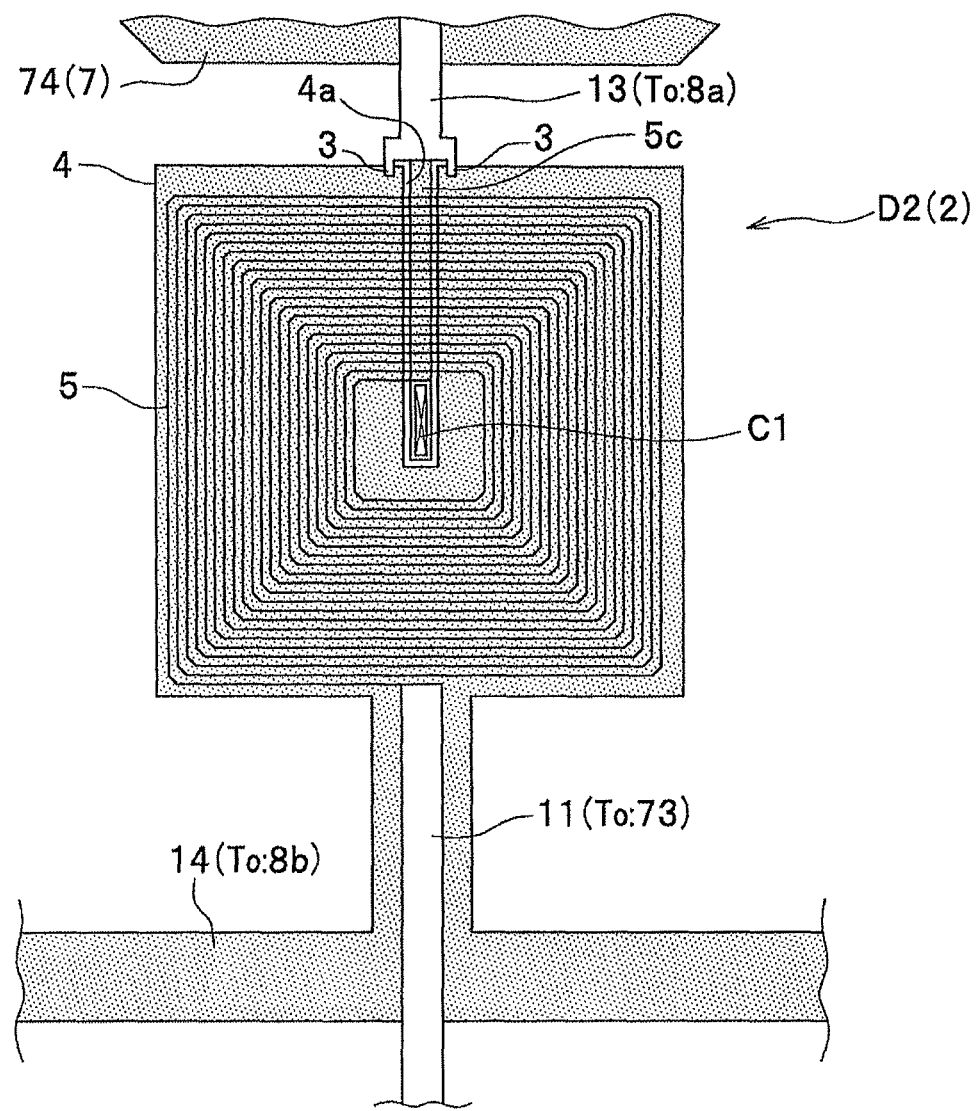
FIG. 12C is an enlarged view around the SQUID of FIG. 12B.

As shown in FIG. 12B and FIG. 12C, since the input coil 5 has a multi-turn structure, the inductance $L_i$ of the input coil 5 is sufficiently larger than the inductance $L_w$ of the trimming wire 6 ($L_w \ll L_i$). Therefore, when a shielding current $I_p$ is generated in the pickup coils 71(7) and 72(2), the shielding current $I_p$ mainly flows in the closed loops L21(L2) and L22

(L2) through the trimming wires 61(6) and 62(6), and hardly flows in the flux transformer (a closed loop on the input coil side) through the input coil 5. As a result, a shielding current $I_p$ corresponding to a difference between magnetic fluxes that interlink with respective closed loops L21 and L22 flows in the center portion 74(7) of the pickup coil.

The integrated SQUID 2 (D1) as well as the input coil 5 thereof and the integrated SQUID 2 (D2) as well as the input coil 5 thereof have a line-symmetric structure with each other.

Enlarged views around the SQUID 2 (D2) are shown in FIG. 12B and FIG. 12C. A lead wire 5c is formed inside a slit 4a of the SQUID inductor 4. One end of the lead wire 5c is connected to an inner terminal of the input coil 5 through the contact hole C1. The other end of the lead wire 5c is connected to the center portion 74 (7) of the pickup coil through under a wiring 13 which is insulated and disconnected from the lead wire 5c. An outer terminal of the input coil 5 is connected to the top and bottom portion 73(7) at the center of the lower pickup coil through the wiring 11 and the contact hole C8. The wiring 11 passes above a wiring 14 which is insulated and disconnected from the wiring 11. As described above, the input coil 5 is connected between the center portion 74(7) of the pickup coil and the top and bottom portion 73(7) at the center of the pickup coil. In addition, different from the second embodiment, the input coil 5 is not connected to the SQUID inductor 4.

Figure 13:
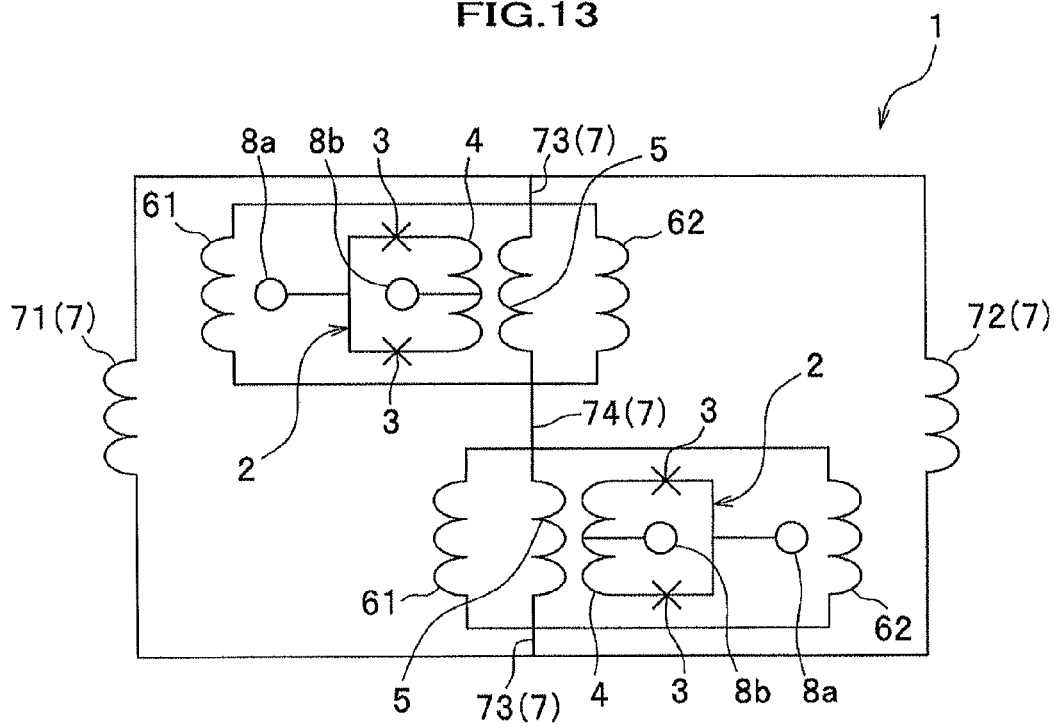
FIG. 13 is a circuit diagram of the HTS magnetic sensor (before a trimming wire is cut off) according to the fifth embodiment of the present invention.

An equivalent circuit diagram of the HTS magnetic sensor 1 according to the fifth embodiment of the present invention is shown in FIG. 13. FIG. 13 shows a status before the trimming wires 61(6), 62(6) are cut off. It can be seen that the input coil 5 is magnetically coupled with the SQUID inductor 4 and not connected to the SQUID inductor 4.

Figure 14:
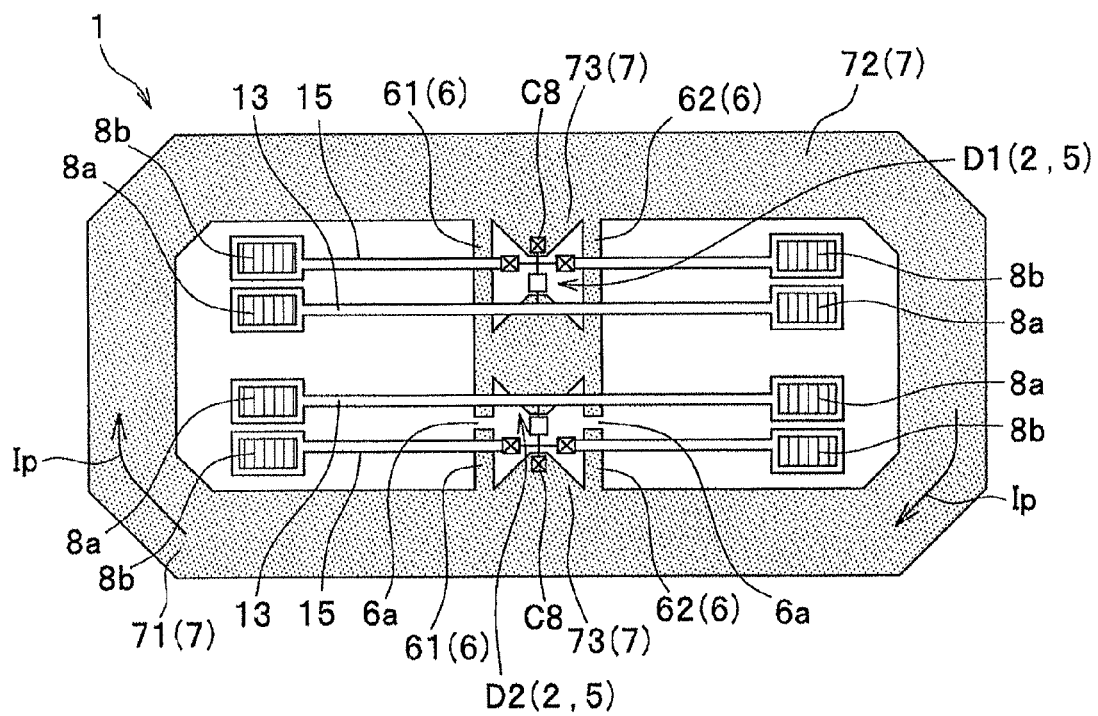
FIG. 14 is a plan view of the HTS magnetic sensor (after a trimming wire is cut off) according to the fifth embodiment of the present invention.
Figure 15:
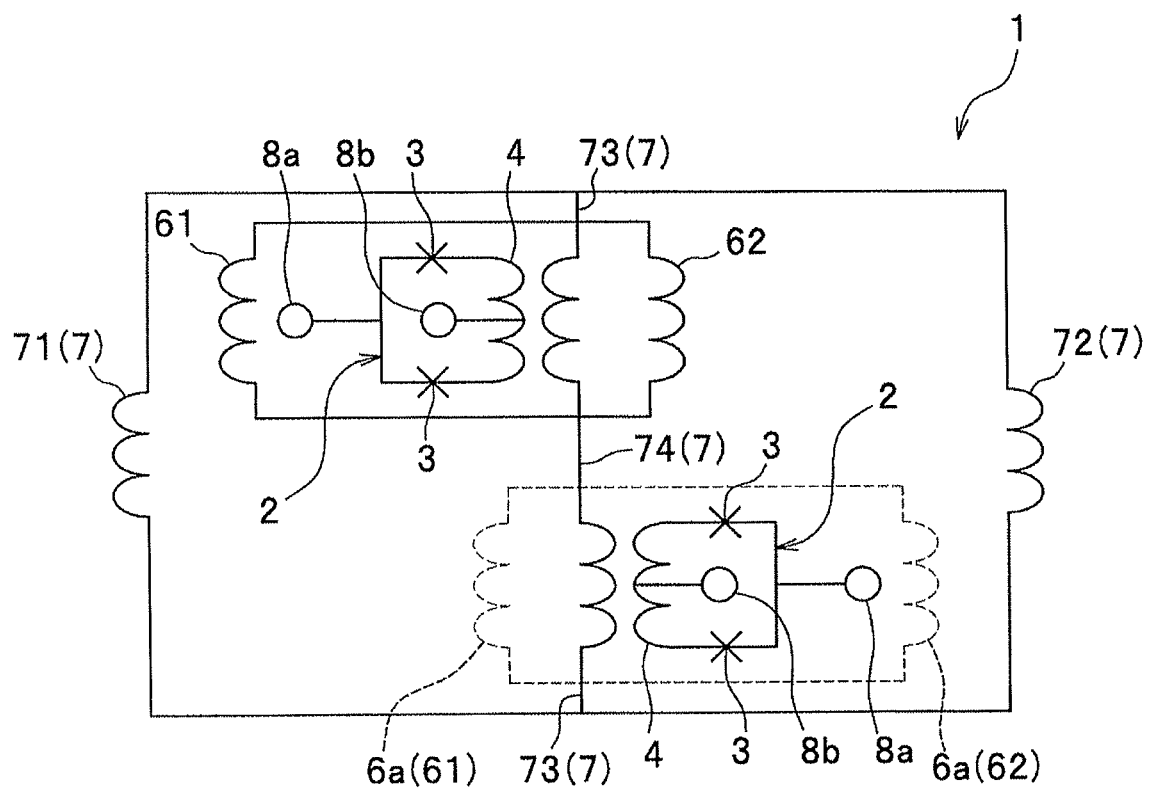
FIG. 15 is a circuit diagram of the HTS magnetic sensor (after a trimming wire is cut off) according to the fifth embodiment of the present invention.

FIG. 14 and FIG. 15 show statuses of the HTS magnetic sensor 1 according to the fifth embodiment of the present invention after the two trimming wires 61(6) and 62(6) that shunt both ends of the input coil 5 which is magnetically coupled with the integrated SQUID 2 (D2), are cut off. After the two trimming wires 61(6) and 62(6) are cut off, a cut-off portion 6a is generated. By this cutting-off, a shielding current $I_p$ flowing in the center portion 74 (7) of the integrated SQUID 2 (D2) and corresponding to a difference between magnetic fluxes that interlink with respective closed loops L21 and L22, flows into the input coil 5 of the integrated SQUID 2 (D2), and as a result, the shielding current $I_p$ can be detected by the integrated SQUID 2 (D2). Since the trimming wires 61(6) and 62(6) are both cut off, a geometric balance between the pickup coil 71(7) and the pickup coil 72(7) on the right and left is maintained.

In addition, before the cutting off of the trimming wires 61(6) and 62(6), the measurement and selection of the integrated SQUID 2 (D1, D2) can be implemented as with second embodiment.

What is claimed is:

1. A high-temperature superconducting magnetic sensor having a superconducting layer formed on a substrate and a plurality of superconducting quantum interference devices fabricated on the superconducting layer, comprising:
    a plurality of input coils that are formed on the superconducting layer and connected to or magnetically coupled with each of the plurality of the superconducting quantum interference devices;
    a pickup coil that is formed on the superconducting layer and connected so as to form a closed loop together with the plurality of the input coils; and
    a plurality of trimming wires that are formed on the superconducting layer and can be cut off, while making a short-circuit between both ends of each of the plurality of the input coils.

2. A high-temperature superconducting magnetic sensor according to claim 1,
    wherein a part of the plurality of trimming wires is cut off.

3. The high-temperature superconducting magnetic sensor according to claim 1,
    wherein structure designs of the plurality of superconducting quantum interference devices are different to each other.

4. The high-temperature superconducting magnetic sensor according to claim 1,
    wherein structure designs of the plurality of the input coils are different to each other.

5. The high-temperature superconducting magnetic sensor according to claim 1,
    wherein an inductance of each of the plurality of the trimming wires is smaller than an inductance of each of the plurality of the input coils.

6. The high-temperature superconducting magnetic sensor according to claim 1,
    wherein the superconducting layer includes a first superconducting layer formed on the substrate and a second superconducting layer formed above the first superconducting layer through an insulating layer,
    wherein inductors of the plurality of the superconducting quantum interference devices and the plurality of the input coils are formed on the different superconducting layers of the first superconducting layer and the second superconducting layer, each other, facing with each other across the insulating layer,
    wherein the plurality of the input coils have a multi-turn structure.

7. The high-temperature superconducting magnetic sensor according to claim 1,
    wherein a part of the plurality of the input coils has a function as an inductor of a part of the plurality of the superconducting quantum interference devices.

8. The high-temperature superconducting magnetic sensor according to claim 2,
    wherein a part of the plurality of the input coils has a function as an inductor of a part of the plurality of the superconducting quantum interference devices.

9. The high-temperature superconducting magnetic sensor according to claim 1,
    wherein the pickup coil has a gradiometer configuration that includes a first pickup coil forming a first closed loop together with the plurality of the input coils, and a second pickup coil that is arranged side-by-side with the first pickup coil across the plurality of the input coils and forms a second closed loop together with the plurality of the input coils;
    wherein the plurality of the trimming wires includes a first trimming wire that is arranged on a side of the first pickup coil for each of the plurality of the input coils and shunts both ends of each of the plurality of the input coils, and a second trimming wire that is arranged on a side of the second pickup coil for each of the plurality of the input coils and shunts both ends of each of the plurality of the input coils.

10. The high-temperature superconducting magnetic sensor according to claim 2,
    wherein the pickup coil has a gradiometer configuration that includes a first pickup coil forming a first closed loop together with the plurality of the input coils, and a second pickup coil that is arranged side-by-side with the first pickup coil across the plurality of the input coils and forms a second closed loop together with the plurality of the input coils;

wherein the plurality of the trimming wires includes a first trimming wire that is arranged on a side of the first pickup coil for a part of the plurality of the input coils and shunts both ends of the part of the plurality of the input coils, and a second trimming wire that is arranged on a side of the second pickup coil for the part of the plurality of the input coils and shunts both ends of the part of the plurality of the input coils.

11. The high-temperature superconducting magnetic sensor according to claim 1, wherein the plurality of the input coils include a first input coil that is magnetically coupled with a part of the plurality of the superconducting quantum interference devices, and a second input coil that is connected to the first input coil in series and has a function as an inductor of another part of the plurality of superconducting quantum interference devices;

wherein the pickup coil is connected so as to form a closed loop together with the first input coil and the second input coil; and wherein the plurality of the trimming wires shunt both ends of a serial connection of the first input coil and the second input coil.

12. The high-temperature superconducting magnetic sensor according to claim 2, wherein the plurality of the input coils include a first input coil that is magnetically coupled with a part of the plurality of the superconducting quantum interference devices, and a second input coil that is connected to the first input coil in series and has a function as an inductor of another part of the plurality of superconducting quantum interference devices;

wherein the pickup coil is connected so as to form a closed loop together with the first input coil and the second input coil; and wherein the plurality of the trimming wires shunt both ends of a serial connection of the first input coil and the second input coil.

13. A high-temperature superconducting magnetic sensor having a superconducting layer formed on a substrate and a plurality of superconducting quantum interference devices fabricated on the superconducting layer, comprising:

a first input coil that is formed on the superconducting layer and magnetically coupled with one superconducting quantum interference device among the plurality of the superconducting quantum interference devices;

a second input coil that is formed on the superconducting layer and has a function as an inductor of the one superconducting quantum interference device among the plurality of the superconducting quantum interference devices; and a pickup coil that is formed on the superconducting layer and connected so as to form a closed loop together with the first input coil and the second input coil.

14. The high-temperature superconducting magnetic sensor according to claim 1, further comprising:

a thin film ring formed on the superconducting layer, wherein the ring is a serial connection of the pickup coil and the plurality of the trimming wires.

15. The high-temperature superconducting magnetic sensor according to claim 2, further comprising:

a thin film ring formed on the superconducting layer, wherein the ring is a serial connection of the pickup coil and the plurality of the trimming wires.

16. The high-temperature superconducting magnetic sensor according to claim 14, wherein the plurality of the trimming wires are arranged on an outer circumferential side of the ring;

the plurality of the input coils are arranged on an inner circumferential side of the ring; and a slit is formed between each of the plurality of the input coils and each of the plurality of the trimming wires in the ring, wherein a width of the ring corresponding to each of the plurality of the trimming wires is narrower than the width of the ring corresponding to each of the plurality of the pickup coils.

17. The high-temperature superconducting magnetic sensor according to claim 15, wherein the plurality of the trimming wires are arranged on an outer circumferential side of the ring;

the plurality of the input coils are arranged on an inner circumferential side of the ring; and a slit is formed between each of the plurality of the input coils and each of the plurality of the trimming wires in the ring, wherein a width of the ring corresponding to each of the plurality of the trimming wires is narrower than the width of the ring corresponding to each of the plurality of the pickup coils.

18. The high-temperature superconducting magnetic sensor according to claim 14, wherein in the ring corresponding to a part of the plurality of the trimming wires, the superconducting layer is ground off to open the ring.

19. The high-temperature superconducting magnetic sensor according to claim 15, wherein in the ring corresponding to a part of the plurality of the trimming wires, the superconducting layer is ground off to open the ring.

20. A method for fabricating a high-temperature superconducting magnetic sensor having a superconducting layer formed on a substrate and a plurality of superconducting quantum interference devices fabricated on the superconducting layer, the method comprising:

forming a plurality of input coils that are connected to or magnetically coupled with each of the superconducting quantum interference devices, a pickup coil that is connected so as to form a closed loop together with the plurality of the input coils and a plurality of trimming wires that shunt between both ends of each of the plurality of the input coils, on the superconducting layer;

selecting a superconducting quantum interference device suitable for an application of the high-temperature superconducting magnetic sensor from the plurality of the superconducting quantum interference devices based on measurement results of electric and magnetic characteristics of the plurality of the superconducting quantum interference devices; and cutting off a trimming wire that shunts between both ends of an input coil that is connected to or magnetically coupled with a selected superconducting quantum interference device.

* * * * *